(12) United States Patent
Hong et al.

(10) Patent No.: US 12,426,412 B2
(45) Date of Patent: Sep. 23, 2025

(54) DISPLAY DEVICE

(71) Applicant: Samsung Display Co., LTD., Yongin-si (KR)

(72) Inventors: Kwang Taek Hong, Seoul (KR); Ki Nyeng Kang, Sejong-si (KR); Jong Hyuk Kang, Suwon-si (KR); Jin Taek Kim, Yongin-si (KR); Tae Woo Kim, Seoul (KR); Do Yeong Park, Hwaseong-si (KR); Hee Keun Lee, Suwon-si (KR); Hyun Deok Im, Seoul (KR); Su Min Choi, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 731 days.

(21) Appl. No.: 17/592,486

(22) Filed: Feb. 3, 2022

(65) Prior Publication Data
US 2022/0271201 A1 Aug. 25, 2022

(30) Foreign Application Priority Data
Feb. 24, 2021 (KR) .......................... 10-2021-0024818

(51) Int. Cl.
H10H 20/857 (2025.01)
H01L 25/16 (2023.01)
H10H 20/831 (2025.01)
H10H 29/14 (2025.01)

(52) U.S. Cl.
CPC ...... *H10H 20/8312* (2025.01); *H10H 20/857* (2025.01); *H10H 29/142* (2025.01)

(58) Field of Classification Search
CPC ............ H10H 20/8312; H10H 20/857; H10H 29/142; H10H 20/819; H01L 25/167; H01L 25/0753; H10D 86/441
See application file for complete search history.

(56) References Cited

U.S. PATENT DOCUMENTS

| 2020/0075667 A1 | 3/2020 | Lee et al. |
| 2021/0399043 A1 | 12/2021 | Lee et al. |
| 2022/0005979 A1 | 1/2022 | Kang |

(Continued)

FOREIGN PATENT DOCUMENTS

| KR | 1020200028065 | 3/2020 |
| KR | 1020200042075 A | 4/2020 |

(Continued)

*Primary Examiner* — David Vu
(74) *Attorney, Agent, or Firm* — CANTOR COLBURN LLP

(57) ABSTRACT

A display device includes subpixels arranged in a first direction and a second direction, where each of the subpixels includes an emission area and a sub area arranged in the first direction therein, electrodes extending in the first direction across the emission area and the sub area, where the electrodes includes a first electrode, a second electrode spaced apart from the first electrode in the second direction, a third electrode disposed between the first electrode and the second electrode, and a fourth electrode spaced apart from the third electrode in the second direction with the first electrode interposed therebetween, first light emitting elements disposed on the first electrode and the fourth electrode, and second light emitting elements disposed on the second electrode and the third electrode. A length of the third electrode in the first direction is smaller than a length of the first electrode in the first direction.

20 Claims, 26 Drawing Sheets

(56) References Cited

U.S. PATENT DOCUMENTS

2022/0123026 A1   4/2022  Oh et al.
2022/0139319 A1   5/2022  Oh et al.

FOREIGN PATENT DOCUMENTS

| KR | 1020200062458 | 6/2020 |
| KR | 1020200088954 | 7/2020 |
| KR | 1020200105598 | 9/2020 |
| KR | 1020200121956 | 10/2020 |
| WO | 2021230426 A1 | 11/2021 |

DISPLAY DEVICE

This application claims priority to Korean Patent Application No. 10-2021-0024818, filed on Feb. 24, 2021, and all the benefits accruing therefrom under 35 U.S.C. § 119, the content of which in its entirety is herein incorporated by reference.

BACKGROUND

1. Field

The disclosure relates to a display device.

2. Description of the Related Art

Display devices are becoming increasingly important with the development of multimedia. Accordingly, various types of display devices such as organic light emitting displays and liquid crystal displays are widely used in various fields.

A display device typically includes a display panel such as an organic light emitting display panel or a liquid crystal display panel as a device for displaying an image of the display device. Among display panels, a light emitting display panel may include light emitting elements such as light emitting diodes ("LED"s). For example, the LEDs may be organic LEDs using an organic material as a light emitting material or may be inorganic LEDs using an inorganic material as the light emitting material.

SUMMARY

Embodiments of the disclosure provide a display device with improved electrode structure.

In embodiments of a display device, the intensity of an electric field generated in an unwanted area is reduced and misplacement of light emitting elements aligned by an electric field may be minimized by improving connection structure of electrodes or electrode lines.

According to an embodiment of the disclosure, a display device includes a plurality of subpixels arranged in a first direction and a second direction different from the first direction, where each of the subpixels includes an emission area and a sub area arranged in the first direction therein, a plurality of electrodes extending in the first direction across the emission area and the sub area, where the electrodes include a first electrode, a second electrode spaced apart from the first electrode in the second direction, a third electrode disposed between the first electrode and the second electrode, and a fourth electrode spaced apart from the third electrode in the second direction with the first electrode interposed therebetween, a plurality of first light emitting elements disposed on the first electrode and the fourth electrode, and a plurality of second light emitting elements disposed on the second electrode and the third electrode, where a length of the third electrode in the first direction is smaller than a length of the first electrode in the first direction.

In an embodiment, a number of the electrodes disposed at a boundary between subpixels neighboring in the first direction may be smaller than a number of the electrodes disposed in the emission area.

In an embodiment, the emission area may include a first portion in which the third electrode is disposed and a second portion in which the third electrode is not disposed, and an average distance between the electrodes spaced apart in the second direction in the first portion may be smaller than an average distance between the electrodes spaced apart in the second direction in the second portion.

In an embodiment, each of the first electrode and the fourth electrode may include an end in the first direction disposed in the sub area and another end disposed in the sub area of another subpixel neighboring in the first direction, and the third electrode may have an end in the first direction disposed in the sub area and another end disposed in the emission area.

In an embodiment, the second electrode may extend in the first direction across the subpixels arranged in the first direction.

In an embodiment, the first electrode may further include a first electrode expansion part disposed in the sub area, and the second electrode may further include a second electrode expansion part disposed in the emission area, where the first electrode expansion part may be connected to a conductive layer thereunder through a first electrode contact hole, and the second electrode expansion part may be connected to a conductive layer thereunder through a second electrode contact hole.

In an embodiment, the third electrode may further include a third electrode expansion part disposed in the sub area.

In an embodiment, each of the electrodes may comprise main electrode parts disposed in the emission area, respectively, and a distance between the main electrode parts of the electrodes spaced apart in the second direction may be smaller than a distance between other parts of the electrodes.

In an embodiment, ends of the first light emitting elements may be disposed on a first main electrode part of the first electrode and a fourth main electrode part of the fourth electrode, and ends of the second light emitting elements may be disposed on a second main electrode part of the second electrode and a third main electrode part of the third electrode.

In an embodiment, a direction in which first ends of the first light emitting elements face may be opposite to a direction in which first ends of the second light emitting elements face.

In an embodiment, the subpixels may include a first subpixel and a second subpixel neighboring the first subpixel in the second direction, and the emission area of the second subpixel may be located diagonally to the emission area of the first subpixel.

In an embodiment, the another end of the third electrode of the first subpixel may extend from the end disposed in the sub area toward a side of the first direction, and the another end of the third electrode of the second subpixel may extend from the end disposed in the sub area toward another side of the first direction.

In an embodiment, the display device may further include a first insulating layer disposed on the electrodes, a first contact electrode disposed on the first electrode to contact the first light emitting elements, a second contact electrode disposed on the second electrode to contact the second light emitting elements, and a third contact electrode disposed on the third electrode and the fourth electrode to contact the first light emitting elements and the second light emitting elements, where the first light emitting elements and the second light emitting elements may be disposed directly on the first insulating layer.

In an embodiment, the third contact electrode may include a first extending part disposed on the third electrode, a second extending part disposed on the fourth electrode, and a plurality of first connecting parts connecting the first extending part and the second extending part to surround the first contact electrode.

In an embodiment, the first contact electrode may contact the first electrode by a first contact part disposed through the first insulating layer, the second contact electrode may contact the second electrode by a second contact part disposed through the first insulating layer, the first extending part of the third contact electrode may contact the third electrode by a third contact part disposed through the first insulating layer, and the second extending part of the third contact electrode may contact the fourth electrode by a fourth contact part disposed through the first insulating layer.

In an embodiment, the first contact part, the second contact part, the third contact part, and the fourth contact part may be disposed in the sub area.

According to an embodiment of the disclosure, a display device includes a plurality of subpixels arranged in a first direction and a second direction different from the first direction, where each of the subpixels includes an emission area and a sub area arranged in the first direction therein, a plurality of electrodes extending in the first direction and spaced apart from each other in the second direction, and a plurality of light emitting elements disposed on the electrodes and spaced apart from each other in the second direction, where the electrodes includes a plurality of first type electrodes extending from the sub area of one subpixel to the sub area of another subpixel neighboring in the first direction beyond the emission area and a second type electrode disposed across the sub area and the emission area of one subpixel.

In an embodiment, the electrodes may further include a third type electrode extending in the first direction across the subpixels arranged in the first direction.

In an embodiment, the emission area may include a first portion in which the second type electrode is disposed and a second portion in which the second type electrode is not disposed, and an average distance between the electrodes spaced apart in the second direction in the first portion may be smaller than an average distance between the electrodes spaced apart in the second direction in the second portion.

In an embodiment, A length of each of the first type electrodes in the first direction may be greater than a length of the second type electrode in the first direction.

BRIEF DESCRIPTION OF THE DRAWINGS

These and/or other features of embodiments of the invention will become apparent and more readily appreciated by describing in further detail embodiments thereof with reference to the accompanying drawings, in which.

DETAILED DESCRIPTION

Figure 1A:
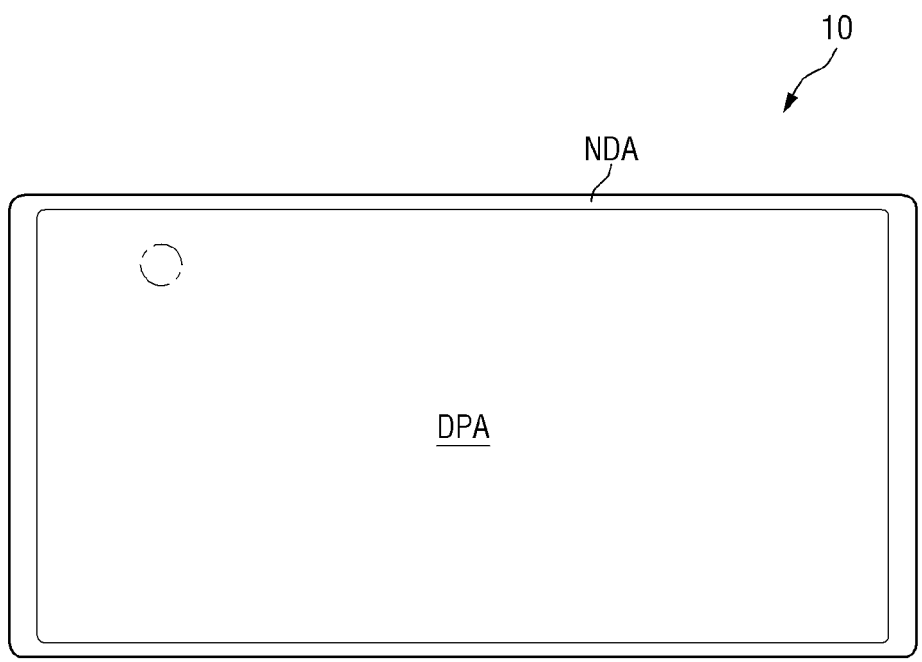
FIG. 1A is a schematic plan view of a display device according to an embodiment.

The invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 1A:
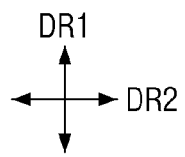
Figure 1B:
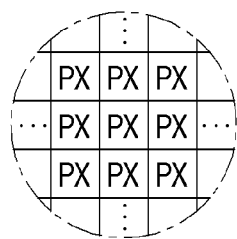
FIG. 1B is an enlarged view of the encircled portion of FIG. 1A.

FIG. 1A is a schematic plan view of a display device 10 according to an embodiment, and FIG. 1B is an enlarged view of the encircled portion of FIG. 1A.

Referring to FIGS. 1A and 1B, an embodiment of the display device 10 displays moving images or still images. The display device 10 may refer to any electronic device provided with a display screen, including, for example, televisions, notebook computers, monitors, billboards, the Internet of things ("IoT") mobile phones, smartphones, tablet personal computers (PCs), electronic watches, smart watches, watch phones, head mounted displays, mobile communication terminals, electronic notebooks, electronic books, portable multimedia players ("PMP"s), navigation devices, game machines, digital cameras and camcorders, all of which provide a display screen.

The display device 10 includes a display panel that provides a display screen. In an embodiment, the display panel include inorganic light emitting diode display panels, organic light emitting display panels, quantum dot light emitting display panels, plasma display panels, or field emission display panels. Hereinafter, for convenience of description, embodiment where the display panel is an inorganic light emitting diode display panel will be described in detail, but the disclosure is not limited thereto, and alternatively, other types of display panel may be applied without departing from the spirit or scope of the invention.

The shape of the display device 10 may be variously modified. In one embodiment, for example, the display device 10 may have various shapes such as a horizontally long rectangle, a vertically long rectangle, a square, a quadrangle with rounded corners (vertices), other polygons, and a circle. The shape of a display area DPA of the display device 10 may correspond to or be similar to the overall shape of the display device 10. In an embodiment, as show in FIG. 1, the display device 10 may have a rectangular shape that is long in a second direction DR2.

The display device 10 may include the display area DPA and anon-display area NDA. The display area DPA may be an area that defines a screen where an image is displayed, and the non-display area NDA may be an area where no screen is defined. The display area DPA may also be referred to as an active area, and the non-display area NDA may also be referred to as an inactive area. The display area DPA may generally occupy a center portion of the display device 10.

In an embodiment, as shown in FIG. 1B, the display area DPA may include a plurality of pixels PX. The pixels PX may be arranged substantially in a matrix form. Each of the pixels PX may be rectangular or square in a plan view. However, the disclosure is not limited thereto, and each of the pixels PX may also have a rhombus shape having each side inclined with respect to a predetermined direction. The pixels PX may be arranged in a stripe type or a pentile type. In an embodiment, each of the pixels PX may include one or more light emitting elements which emit light of a specific wavelength band to display a specific color.

The non-display area NDA may be disposed around the display area DPA. The non-display area NDA may entirely or partially surround the display area DPA. In an embodiment, the display area DPA may be rectangular, and the non-display area NDA may be disposed adjacent to four sides of the display area DPA. The non-display area NDA may form a bezel of the display device 10. In each non-display area NDA, wirings or circuit drivers included in the display device 10 may be disposed, or external devices may be mounted.

Figure 2:
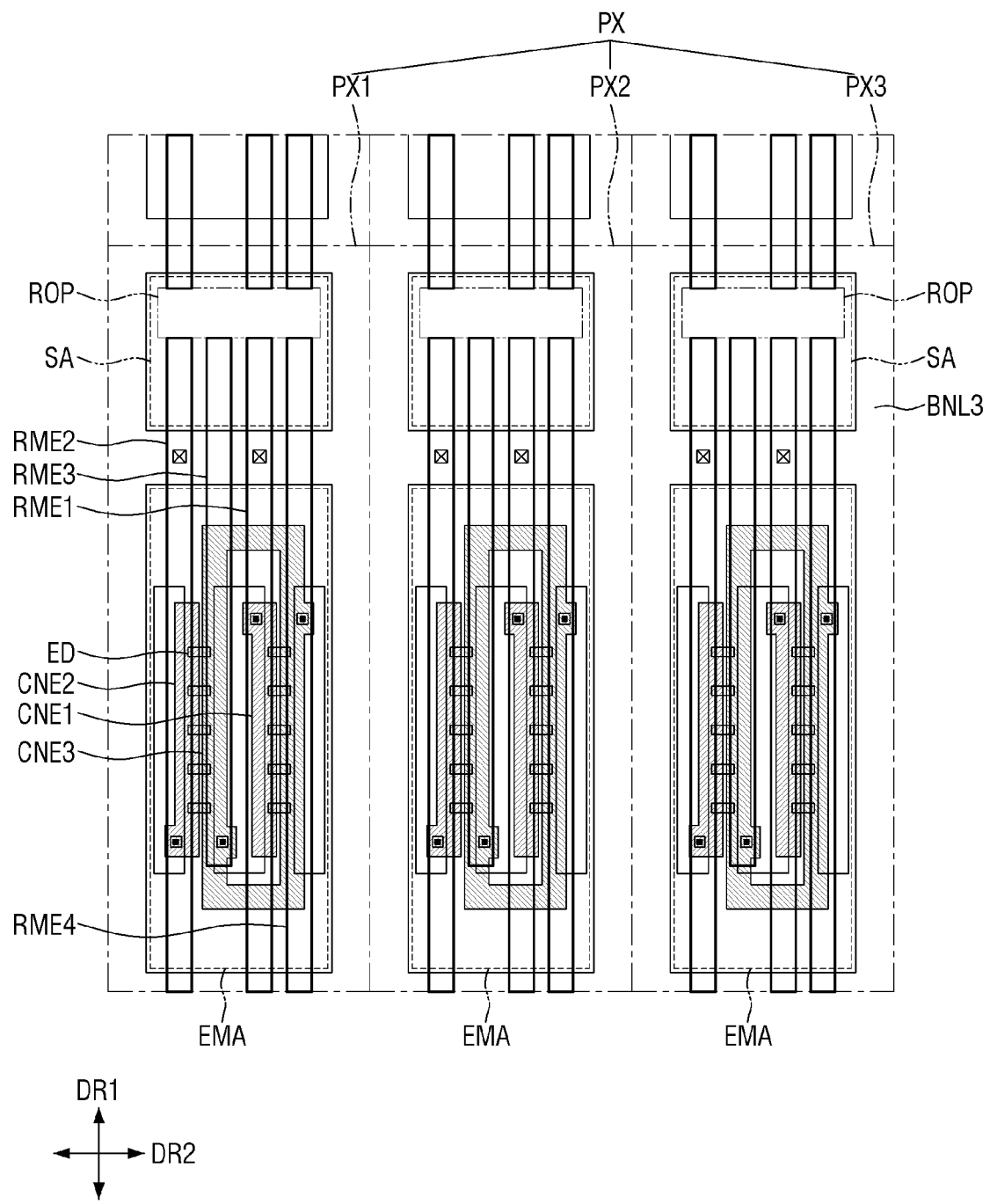
FIG. 2 is a plan view of a pixel of the display device according to an embodiment.

FIG. 2 is a plan view of a pixel PX of the display device 10 according to an embodiment. In FIG. 2, one pixel PX and a part of another pixel PX neighboring the pixel PX in a first direction DR1 are illustrated together.

Referring to FIG. 2, each of the pixels PX of the display device 10 may include a plurality of subpixels PXn, where n is 1 to 3. In one embodiment, for example, one pixel PX may include a first subpixel PX1, a second subpixel PX2, and a third subpixel PX3. The first subpixel PX1 may emit light of a first color, the second subpixel PX2 may emit light of a second color, and the third subpixel PX3 may emit light of a third color. In one embodiment, for example, the first color may be blue, the second color may be green, and the third color may be red. However, the disclosure is not limited thereto, and the subpixels PXn may also emit light of a same color as each other. In an embodiment, one pixel PX may include three subpixels PXn as shown in FIG. 2, but the disclosure is not limited thereto. Alternatively, the pixel PX may also include four or more subpixels PXn.

Each subpixel PXn of the display device 10 may include an emission area EMA and a non-emission area (not illustrated). The emission area EMA may be an area in which light emitting elements ED are disposed to emit light of a specific wavelength band. The non-emission area may be an area in which the light emitting elements ED are not disposed and from which no light is output because light emitted from the light emitting elements ED does not reach thereto. The emission area may include an area in which the light emitting elements ED are disposed and an area which is adjacent to the light emitting elements ED and to which light emitted from the light emitting elements ED is output.

However, the disclosure is not limited thereto, and alternatively, the emission area EMA may also include an area from which light emitted from the light emitting elements ED is output after being reflected or refracted by other members. A plurality of light emitting elements ED may be disposed in each subpixel PXn, and an area where the light emitting elements ED are disposed and an area adjacent to this area may form the emission area.

In an embodiment, as shown in FIG. 2, the respective emission areas EMA of the subpixels PXn have substantially a same area as each other, but the disclosure is not limited thereto. In an alternative embodiment, the emission area EMA of each subpixel PXn may have a different area according to the color or wavelength band of light emitted from the light emitting elements ED disposed in the corresponding subpixel PXn.

In an embodiment, each subpixel PXn may further include a sub area SA disposed in the non-emission area. The sub area SA may be disposed on a side of the emission area EMA in the first direction DR1 and may be disposed between the emission areas EMA of subpixels PXn neighboring in the first direction DR1. In one embodiment, for example, a plurality of emission areas EMA and a plurality of sub areas SA may be repeatedly arranged in the second direction DR2 but may be alternately arranged in the first direction DR1. However, the disclosure is not limited thereto, and the arrangement of the emission areas EMA and the sub areas SA in a plurality of pixels PX may be modified to be different from that shown in FIG. 2.

A third bank BNL3 may be disposed between the sub areas SA and the emission areas EMA, and a distance between the sub areas SA and the emission areas EMA may vary according to a width of the third bank BNL3. Light may not exit from the sub area SA because the light emitting elements ED are not disposed in the sub area SA, but parts of electrodes RME disposed in each subpixel PXn may be disposed in the sub area SA. The electrodes RME disposed in different subpixels PXn may be separated from each other in a separation part ROP of the sub area SA.

The third bank BNL3 may include parts extending in the first direction DR1 and the second direction DR2 in a plan view to form a grid pattern in the entire display area DPA. The third bank BNL3 may be disposed at the boundary of each subpixel PXn to separate neighboring subpixels PXn from each other. In an embodiment, the third bank BNL3 may surround the emission area EMA disposed in each subpixel PXn to separate emission areas EMA from each other.

Figure 3:
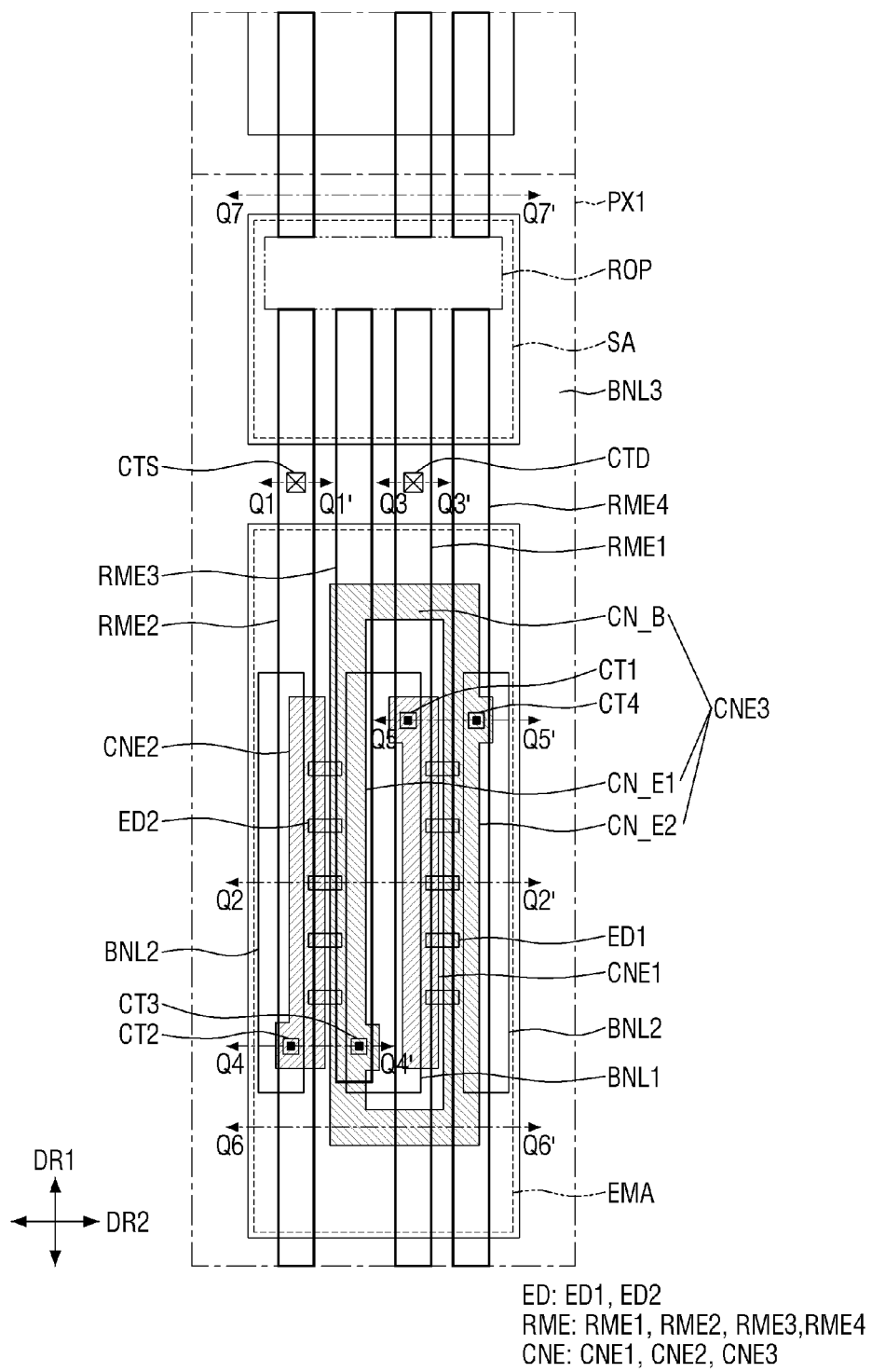
FIG. 3 is a plan view of a first subpixel of FIG. 2.
Figure 4:
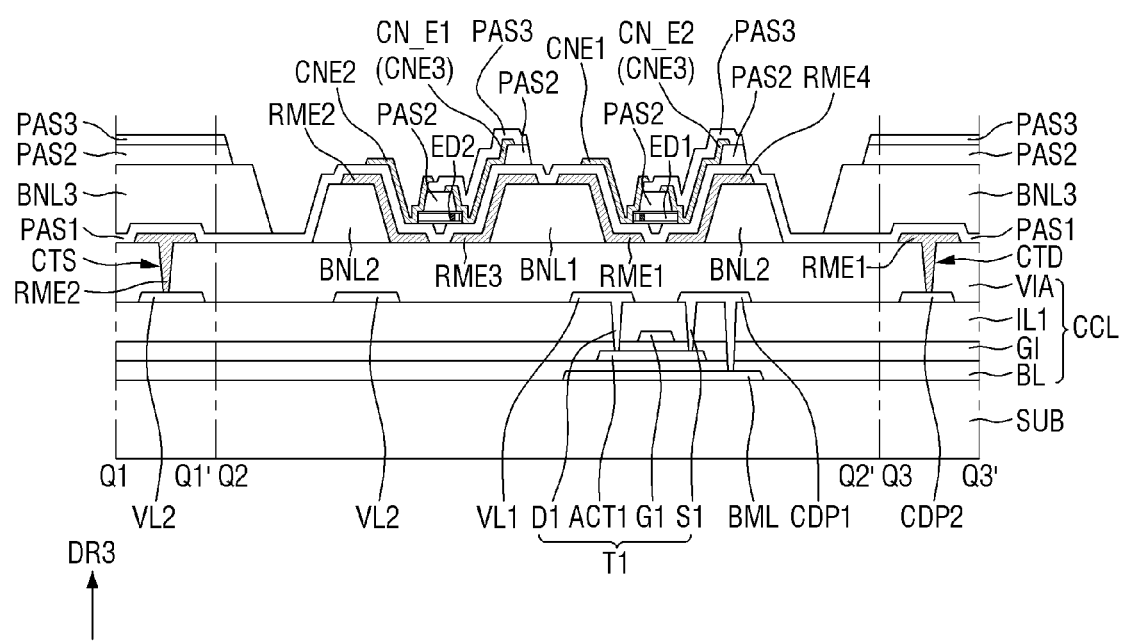
FIG. 4 is a cross-sectional view taken along lines Q1-Q1', Q2-Q2' and Q3-Q3' of FIG. 3.
Figure 5:
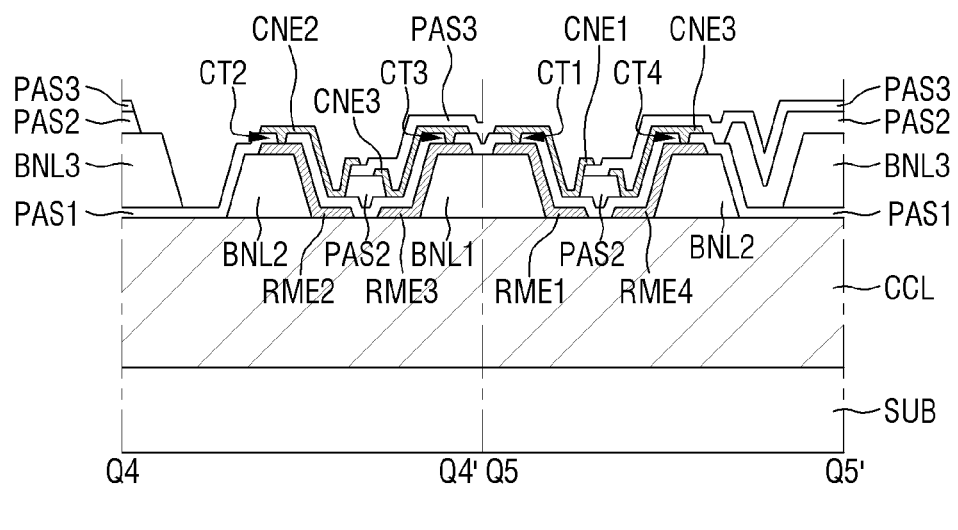
FIG. 5 is a cross-sectional view taken along lines Q4-Q4' and Q5-Q5' of FIG. 3.

FIG. 3 is a plan view of the first subpixel PX1 of FIG. 2. FIG. 4 is a cross-sectional view taken along lines Q1-Q1', Q2-Q2' and Q3-Q3' of FIG. 3. FIG. 5 is a cross-sectional view taken along lines Q4-Q4' and Q5-Q5' of FIG. 3. FIG. 3 illustrates the first subpixel PX1 included in a pixel PX, together with a part of another subpixel PXn neighboring the first subpixel PX1 in the first direction DR1. FIG. 4 illustrates a cross section across opposing ends of different light emitting elements ED disposed in the first subpixel PX1. FIG. 5 illustrates a cross section across a plurality of contact parts CT1 through CT4 in the first subpixel PX1.

Referring to FIGS. 3 through 5 in conjunction with FIG. 2, an embodiment of the display device 10 may include a first substrate SUB and a semiconductor layer, a plurality of conductive layers and a plurality of insulating layers disposed on the first substrate SUB. The semiconductor layer, the conductive layers, and the insulating layers may constitute a circuit layer CCL and a display element layer of the display device 10.

The first substrate SUB may be an insulating substrate. The first substrate SUB may include or be made of an insulating material such as glass, quartz, or polymer resin. In an embodiment, the first substrate SUB may be a rigid substrate, or alternatively, may be a flexible substrate that is bendable, foldable, rollable, etc.

A first conductive layer may be disposed on the first substrate SUB. The first conductive layer includes a bottom metal layer BML, and the bottom metal layer BML is disposed to overlap an active layer ACT1 of a first transistor T1 in a third direction DR3 which is a thickness direction of the first substrate SUB or the display device 10. The bottom metal layer BML may include a light blocking material to prevent light from entering the active layer ACT1 of the first transistor T1. Alternatively, the bottom metal layer BML may be omitted.

A buffer layer BL may be disposed on the bottom metal layer BML and the first substrate SUB. The buffer layer BL may be provided on the first substrate SUB to protect transistors of the pixel PX from moisture introduced through the first substrate SUB which is vulnerable to moisture penetration and may perform a surface planarization function.

The semiconductor layer is disposed on the buffer layer BL. The semiconductor layer may include the active layer ACT1 of the first transistor T1. The active layer ACT1 may partially overlap a gate electrode G1 of a second conductive layer, which will be described later.

The semiconductor layer may include polycrystalline silicon, monocrystalline silicon, an oxide semiconductor, or the like. In an embodiment, the semiconductor layer may include polycrystalline silicon. The oxide semiconductor may be an oxide semiconductor containing indium (In). In one embodiment, for example, the oxide semiconductor include at least one selected from indium tin oxide ("ITO"), indium zinc oxide ("IZO"), indium gallium oxide ("IGO"), indium zinc tin oxide ("IZTO"), indium gallium tin oxide ("IGTO"), indium gallium zinc oxide ("IGZO"), and indium gallium zinc tin oxide ("IGZTO").

Although one first transistor T1 in each subpixel PXn of the display device 10 is shown in the drawings, the disclosure is not limited thereto. The display device 10 may include two or more transistors.

A first gate insulating layer GI is disposed on the semiconductor layer and the buffer layer BL. The first gate insulating layer GI may serve as a gate insulating film of the first transistor T1.

The second conductive layer is disposed on the first gate insulating layer GI. The second conductive layer may include the gate electrode G1 of the first transistor T1. The gate electrode G1 may overlap a channel region of the active layer ACT1 in the third direction DR3.

A first interlayer insulating layer IL1 is disposed on the second conductive layer. The first interlayer insulating layer IL1 may function as an insulating film between the second conductive layer and other layers disposed on the second conductive layer and may protect the second conductive layer.

A third conductive layer is disposed on the first interlayer insulating layer IL1. The third conductive layer may include a first voltage line VL1, a second voltage line VL2, and a plurality of conductive patterns CDP1 and CDP2.

A high potential voltage (or a first power supply voltage) to be supplied to a first electrode RME1 may be applied to the first voltage line VL1, and a low potential voltage (or a second power supply voltage) to be supplied to a second electrode RME2 may be applied to the second voltage line VL2. A part of the first voltage line VL1 may contact the active layer ACT1 of the first transistor T1 through a contact hole defined through the first interlayer insulating layer IL1 and the first gate insulating layer GI. The first voltage line VL1 may serve as a first drain electrode D1 of the first transistor T1.

A first conductive pattern CDP1 may contact the active layer ACT1 of the first transistor T1 through a contact hole defined through the first interlayer insulating layer IL1 and the first gate insulating layer GI. In an embodiment, the first conductive pattern CDP1 may contact the bottom metal layer BML through another contact hole. The first conductive pattern CDP1 may serve as a first source electrode S1 of the first transistor T1.

A second conductive pattern CDP2 may be electrically connected to the first transistor T1 through the first conductive pattern CDP1. In an embodiment, the second conductive pattern CDP2 may be integrally formed with the first conductive pattern CDP1 as a single unitary pattern. The second conductive pattern CDP2 may be connected to the first electrode RME1, and the first transistor T1 may transfer the first power supply voltage received from the first voltage line VL1 to the first electrode RME1.

Each of the buffer layer BL, the first gate insulating layer GI, and the first interlayer insulating layer IL1 described above may include or be composed of a plurality of inorganic layers stacked alternately one on another. In one embodiment, for example, each of the buffer layer BL, the first gate insulating layer GI, and the first interlayer insulating layer IL1 may be a double layer in which inorganic layers including at least one selected from silicon oxide ($SiO_x$), silicon nitride ($SiN_x$) and silicon oxynitride ($SiO_xN_y$) are stacked or may be a multilayer in which the inorganic layers are alternately stacked one on another. However, the disclosure is not limited thereto, and alternatively, each of the buffer layer BL, the first gate insulating layer GI, and the first interlayer insulating layer IL1 may include or be composed of one inorganic layer including at least one selected from the above insulating materials. In an embodiment, the first interlayer insulating layer IL1 may include or be made of an organic insulating material such as polyimide ("PI").

Each of the second conductive layer and the third conductive layer may be, but is not limited to, a single layer or a multilayer including or made of at least one selected from molybdenum (Mo), aluminum (Al), chromium (Cr), gold (Au), titanium (Ti), nickel (Ni), neodymium (Nd), copper (Cu), and alloys thereof.

A via layer VIA is disposed on the third conductive layer. The via layer VIA may include an organic insulating material such as PI and perform a surface planarization function.

A plurality of electrodes RME (RME1 through RME4), a first bank BNL1, a plurality of second banks BNL2, the third bank BNL3, a plurality of light emitting elements ED, and a plurality of contact electrodes CNE (CNE1 through CNE3) are disposed as the display element layer on the via layer VIA. In an embodiment, a plurality of insulating layers PAS1 through PAS3 may be disposed on the via layer VIA.

The first bank BNL1 and the second banks BNL2 may be disposed directly on the via layer VIA. The first bank BNL1 and the second banks BNL2 may extend in the first direction DR1 in the emission area EMA and may be spaced apart from each other in the second direction DR2. In one embodiment, for example, the first bank BNL1 may be disposed in the center of the emission area EMA, and the second banks BNL2 may be spaced apart from each other with the first bank BNL interposed between them. One second bank BNL2 may be disposed on a left side of the first bank BNL1, and another second bank BNL2 may be disposed on a right side of the first bank BNL1. The first bank BNL1 and each of the second banks BNL2 may be spaced apart from each other in the second direction DR2, and a plurality of light emitting elements ED may be disposed in a space between them.

A length by which the first bank BNL1 and the second banks BNL2 extend in the first direction DR1 may be smaller than a length, in the first direction DR1, of the emission area EMA surrounded by the third bank BNL3. The first bank BNL1 and the second banks BNL2 may be disposed in the emission area EMA of each subpixel PXn to form island patterns having a relatively small width and extending in one direction in the entire display area DPA. However, the disclosure is not limited thereto. In an alternative embodiment, the first bank BNL1 may extend beyond the emission area EMA to the sub area SA, and the second banks BNL2 may partially overlap the third bank BNL3.

In an embodiment, a width of the first bank BNL1 measured in the second direction DR2 may be greater than a width of each of the second banks BNL2 measured in the second direction DR2. The electrodes RME may be disposed on the first bank BNL2 or the second banks BNL2. In an embodiment, as will be described later, the first bank BNL1 may have a greater width than the second banks BNL2 such that different electrodes RME may be disposed on the first bank BNL1. However, the disclosure is not limited thereto, and alternatively, the first bank BNL1 and the second banks BNL2 may have a same width as each other.

At least a part of each of the first bank BINH and the second banks BNL2 may protrude from an upper surface of the via layer VIA. The protruding part of each of the first bank BNL1 and the second banks BNL2 may have inclined side surfaces, and light emitted from the light emitting elements ED may be reflected upward above the via layer VIA by the electrodes RME disposed on the first bank BNL1 and the second banks BNL2. However, the disclosure is not limited thereto, and alternatively, each of the first bank BNL1 and the second banks BNL2 may have a semicircular or semielliptical shape having outer surface. The first bank BNL1 and the second banks BNL2 may include, but are not limited to, an organic insulating material such as PI.

The electrodes RME extend in one direction and are disposed in each subpixel PXn. The electrodes RME may extend in the first direction DR1 across at least the emission area EMA and the sub area SA of each subpixel PXn and may be spaced apart from each other in the second direction DR2.

In one embodiment, for example, a plurality of electrodes RME disposed in one subpixel PXn may include the first electrode RME1, the second electrode RME2, a third electrode RME3, and a fourth electrode RME4.

The first electrode RME1 may be disposed adjacent to the center of the emission area EMA, and a part of the first electrode RME1 may be disposed on the first bank BNL1. The first electrode RME1 may be disposed on a side surface of the first bank BNL1 which faces the second bank BNL2 disposed on the right side. The second electrode RME2 may be spaced apart from the first electrode RME1 in the second direction DR2, and a part of the second electrode RME2 may be disposed on a side surface of the second bank BNL2 disposed on the left side of the emission area EMA.

The third electrode RME3 may be disposed between the first electrode RME1 and the second electrode RME2 and may be spaced apart from the first electrode RME1 and the second electrode RME2 in the second direction DR2. The third electrode RME3 may be disposed on top of a side of the first bank BNL1 which faces the second bank BNL2 disposed on the left side. The fourth electrode RME4 may be spaced apart from the third electrode RME3 and the first electrode RME1 in the second direction DR2 with the first electrode RME1 interposed between them. The fourth electrode RME4 may be disposed on the second bank BNL2 disposed on the right side of the emission area EMA.

The electrodes RME may be distinguished from each other according to whether they are connected to a conductive layer thereunder. In one embodiment, for example, each of the first electrode RME1 and the second electrode RME2 may be connected to the third conductive layer thereunder, and the third electrode RME3 and the fourth electrode RME4 may not be connected.

The first electrode RME1 and the second electrode RME2 may be connected to the third conductive layer respectively through a first electrode contact hole CTD and a second electrode contact hole CTS formed or defined in a part overlapping the third bank BNL3. The first electrode RME1 may contact the second conductive pattern CDP2 through the first electrode contact hole CTD defined through the via layer VIA under the first electrode RME1. The second electrode RME2 may contact the second voltage line VL2 through the second electrode contact hole CTS defined through the via layer VIA under the second electrode RME2. The first electrode RME1 may be electrically connected to the first transistor T1 through the second conductive pattern CDP2 to receive the first power supply voltage, and the second electrode RME2 may be electrically connected to the second voltage line VL2 to receive the second power supply voltage.

In an embodiment, the third electrode RME3 and the fourth electrode RME4 may not be directly connected to the third conductive layer. The third electrode RME3 and the fourth electrode RME4 may be electrically connected to the first electrode RME1 or the second electrode RME2 through the contact electrodes CNE and the light emitting elements ED to be described later. However, the disclosure is not limited thereto. In an alternative embodiment, the third electrode RME3 and the fourth electrode RME4 may be floating electrodes not electrically connected to other electrodes or the light emitting elements ED.

The electrodes RME may extend in the first direction DR1 across the emission area EMA and the sub area SA, and some of the electrodes RME may extend to another subpixel PXn neighboring in the first direction DR1. The electrodes RME of subpixels PXn neighboring in the first direction DR1 may be separated from each other in the separation part ROP of the sub area SA. The electrodes RME shaped as described above may be formed as or defined by electrode lines (RM1 through RM4 of FIG. 7) extending in the first direction DR1 and utilized to generate an electric field in each subpixel PXn to align the light emitting elements ED in a process of manufacturing the display device 10. The light emitting elements ED may be aligned by a dielectrophoretic force applied by an electric field generated on the electrode lines, and the electrode lines may be separated in the separation part ROP to form the electrodes RME, respectively. Since the electrodes RME are separated in the sub area SA of each subpixel PXn after the alignment of the light emitting elements ED, the light emitting elements ED of different subpixels PXn may emit light individually.

In an embodiment, the electrodes RME of different subpixels PXn neighboring in the first direction DR1 are spaced apart from each other in the separation part ROP of the sub area SA as shown in the drawings, but the disclosure is not limited thereto. In an alternative embodiment, the electrodes RME disposed in each subpixel PXn may also be separated in the separation part ROP formed in the emission area EMA. In such an embodiment, the electrodes RME may be divided into one electrode group located on a side of the separation part ROP and another electrode group located on the other side of the separation part ROP.

The electrodes RME may be disposed on at least the inclined side surfaces of the first bank BNL1 or the second banks BNL2. In an embodiment, a width of each of the electrodes RME measured in the second direction DR2 may be smaller than the width of the first bank BNL1 or the second banks BNL2 measured in the second direction DR2. Each electrode RME may cover at least one side surface of the first bank BNL1 or the second bank BNL2 to reflect light emitted from the light emitting elements ED.

In an embodiment, a distance between the electrodes RME in the second direction DR2 may be smaller than a distance between the first bank BNL1 and the second banks BNL2. At least a part of each electrode RME may be disposed directly on the via layer VIA. Thus, the electrodes RME may be substantially on a same plane as each other.

The electrodes RME may be electrically connected to the light emitting elements ED. Each of the electrodes RME may be connected to the light emitting elements ED through a contact electrode CNE (CNE1, CNE2, CNE3) to be described later and may transfer an electrical signal received from a conductive layer thereunder to the light emitting elements ED.

Each of the electrodes RME may include a conductive material having high reflectivity. In one embodiment, for example, each electrode RME may include a metal such as silver (Ag), copper (Cu) or aluminum (Al) as a material having high reflectivity or may be an alloy including aluminum (Al), nickel (Ni) or lanthanum (La). Each electrode RME may reflect light, which travels toward a side surface of the third bank BNL3 after being emitted from the light emitting elements ED, in an upward direction of each subpixel PXn.

However, the disclosure is not limited thereto, and alternatively, each electrode RME may further include a transparent conductive material. In one embodiment, for example, each electrode RME may include a material such as ITO, IZO or IZTO. In an embodiment, each electrode RME may have a structure in which a transparent conductive material and a metal layer having high reflectivity are each stacked in one or more layers or may be formed as a single layer including a transparent conductive material and a metal. In one embodiment, for example, each electrode RME may have a stacked structure of ITO/Ag/ITO, ITO/Ag/IZO, or ITO/Ag/IZTO/IZO.

As will be described later, opposing ends of the light emitting elements ED are disposed on the electrodes RME spaced apart in the second direction DR2, and most of the light emitting elements ED may be disposed on an electrode disposed on the first bank BNL1 and an electrode disposed on a second bank BNL2 among the electrodes RME. In one embodiment, for example, the light emitting elements ED may be disposed on the first electrode RME1 and the fourth electrode RME4 and on the second electrode RME2 and the third electrode RME3. The light emitting elements ED may not be disposed on the first electrode RME1 and the third electrode RME3 disposed together on the first bank BNL1, or only a few light emitting elements ED may be disposed, although not illustrated in the drawings. Such light emitting elements ED may be light emitting elements ED that are not electrically connected to the electrodes RME and do not emit light.

Opposing ends of the light emitting elements ED may be respectively disposed on electrode lines (see FIG. 7) to which different alignment signals are transmitted in the manufacturing process of the display device 10. The electrode lines may be partially separated in the separation part ROP of the sub area SA to form the electrodes RME of each subpixel PXn. Different electrode lines may form or define different electrodes RME in each subpixel PXn. To distinguish 'different electrode lines,' each electrode line will hereinafter be referred to as an electrode line from which a corresponding electrode originates.' An electric field due to a potential difference may be generated between electrode lines to which different alignment signals are transmitted, and the light emitting elements ED may be placed on the electrode lines by a force applied by the electric field. In an embodiment of the manufacturing process of the display device 10, one electrode line may be disposed across a plurality of subpixels PXn arranged in the first direction DR1, and electric fields due to alignment signals may be generated in the entire display area DPA.

The same alignment signal may be transmitted to electrode lines from which the first electrode RME1 and the third electrode RME originate as electrodes on which opposing ends of one light emitting element ED are not simultaneously disposed among different electrodes RME, and an electric field may not be generated therebetween. In an embodiment, as will be described later, the electrode lines from which the first electrode RME1 and the third electrode RME3 originate may be connected or integrated with each other in the manufacturing process to effectively prevent the light emitting elements ED from being disposed in an unwanted area. If an alignment signal is transmitted to electrode lines connected to each other rather than the same alignment signal being transmitted to electrode lines separated from each other, an electric field may not be generated therebetween, or a very weak electric field may be generated therebetween. Accordingly, the light emitting elements ED may be hardly disposed on the electrode lines.

In an embodiment of a method of connecting electrode lines (like the first electrode RME1 and the third electrode RME3) to which the same alignment signal is transmitted, one electrode line may be disposed across a plurality of subpixels PXn, and another electrode line may not extend to other subpixels PXn but may be connected to the above electrode line. In this case, the number of electrode lines extending in the first direction DR1 across a plurality of subpixels PXn may be reduced, and a space for accommodating electrode lines per unit area may be easily secured. In one embodiment, for example, the electrode line from which the third electrode RME3 originates may not extend beyond the boundaries with other subpixels PXn but may be integrally formed with the electrode line from which the first electrode RME1 originates. While four electrode lines are disposed in the emission area EMA, a smaller number of electrode lines may be disposed at the boundary of each subpixel PXn. Accordingly, even in the arrangement of the electrodes RME formed by separation of electrode lines, the number of the electrodes disposed in the emission area EMA may be different from the number of the electrodes disposed at the boundary between subpixels PXn neighboring in the first direction DR1. In an embodiment, the display device 10 has a structure in which some electrode lines are connected to other electrode lines instead of extending to other subpixels PXn. Therefore, the intensity of an electric field generated in an unwanted area may be reduced, thereby reducing a misalignment rate of the light emitting elements ED, and a space for accommodating electrode lines may be easily secured. This will be described in greater detail later with further reference to other drawings.

A first insulating layer PAS1 is disposed on the via layer VIA and the electrodes RME. The first insulating layer PAS1 may entirely cover the electrodes RME and protect the electrodes RME while insulating the electrodes RME from each other. In an embodiment, the first insulating layer PAS1 may prevent the light emitting elements ED disposed thereon from directly contacting other members and thus being damaged.

In an embodiment, the first insulating layer PAS1 may have a stepped structure such that a part of an upper surface of the first insulating layer PAS1 is depressed between the electrodes RME spaced apart from each other in the second direction DR2. The light emitting elements ED may be disposed on the stepped upper surface of the first insulating layer PAS1, and a space may be defined between each of the light emitting elements ED and the first insulating layer PAS1.

The first insulating layer PAS1 may include a plurality of contact parts CT1 through CT4 partially exposing upper surfaces of the electrodes RME. The contact parts CT1 through CT4 may be disposed through the first insulating layer PAS1, and the contact electrodes CNE to be described later may contact the electrodes RME exposed to the contact parts CT1 through CT4.

The third bank BNL3 may be disposed on the first insulating layer PAS1. The third bank BNL3 may include parts extending in the first direction DR1 and the second direction DR2 to form a grid pattern in a plan view. The third bank BNL3 may be disposed at the boundary of each subpixel PXn to separate neighboring subpixels PXn. In an embodiment, the third bank BNL3 may surround the emission area EMA and the sub area SA, and areas defined and exposed by the third bank BNL3 may be the emission area EMA and the sub area SA, respectively.

The third bank BNL3 may have a predetermined height. In an embodiment, an upper surface of the third bank BNL3 may be at a greater height than those of the first bank BNL1 and the second banks BNL2, and a thickness of the third bank BNL3 may be equal to or greater than those of the first bank BNL1 and the second banks BNL2. The third bank BNL3 may prevent ink from overflowing to adjacent subpixels PXn in an inkjet printing process during the manufacturing process of the display device 10. The third bank BNL3 may prevent inks in which different light emitting elements ED are dispersed for different subpixels PXn from being mixed with each other. In an embodiment, the third bank BNL3 may include, but is not limited to, PI.

The light emitting elements ED may be disposed on the first insulating layer PAS1. Each light emitting element ED may include a plurality of layers disposed in a direction parallel to an upper surface of the first substrate SUB. The direction in which the light emitting elements ED of the display device 10 extend may be parallel to the first substrate SUB, and a plurality of semiconductor layers included in each light emitting element ED may be sequentially arranged along the direction parallel to the upper surface of the first substrate SUB. However, the disclosure is not limited thereto. In an alternative embodiment, when the light emitting elements ED have a different structure, the layers may be arranged in a direction perpendicular to the first substrate SUB.

The light emitting elements ED may be disposed on the electrodes RME spaced apart in the second direction DR2 between the first bank BNL1 and the second banks BNL2. The light emitting elements ED may be spaced apart from each other along the first direction DR1 in which each electrode RME extends and may be aligned substantially parallel to each other. The light emitting elements ED may extend in a direction, and a length by which the light emitting elements ED extend may be greater than a shortest distance between the electrodes RME spaced apart in the second direction DR2. The light emitting elements ED may be disposed such that opposing ends thereof are on different electrodes RME, respectively, and the direction in which each electrode RME extends and the direction in which the light emitting elements ED extend may be substantially perpendicular to each other. However, the disclosure is not limited thereto, and alternatively, the light emitting elements ED may also extend obliquely to the direction in which each electrode RME extends.

The light emitting elements ED disposed in each subpixel PXn may emit light of different wavelength bands from each other depending on the materials of the semiconductor layers therein. However, the disclosure is not limited thereto, and alternatively, the light emitting elements ED disposed in each subpixel PXn may emit light of a same color as each other. In an embodiment, since each light emitting element ED includes the semiconductor layers doped with different conductivity types, each light emitting element ED may be oriented in a way such that an end thereof faces a specific direction by an electric field generated on the electrodes RME.

The light emitting elements ED may be divided into different light emitting elements ED according to the electrodes RME on which opposing ends thereof are disposed. In one embodiment, for example, the light emitting elements ED may include first light emitting elements ED1 having opposing ends disposed on the first electrode RME1 and the fourth electrode RME4 and second light emitting elements ED2 having opposing ends disposed on the second electrode RME2 and the third electrode RME3. As described above, different alignment signals may be transmitted to some of the electrode lines from which the electrodes RME originate, and the light emitting elements ED may be disposed on the electrode lines to which different alignment signals are transmitted.

Each light emitting element ED may include a plurality of semiconductor layers, and a first end and a second end opposite the first end may be defined based on any one semiconductor layer. The electrodes RME on which the first ends and the second ends of the light emitting elements ED are disposed may vary according to alignment signals transmitted to electrode lines. In one embodiment, for example, since the electrode lines from which the first electrode RME1 and the third electrode RME3 originate are integrated with each other and thus the same alignment signal is transmitted to the electrode lines, the first ends of the first light emitting elements ED1 and the second light emitting elements ED2 may be disposed on the first electrode RME1 and the third electrode RME3, respectively, and the second ends may be disposed on the fourth electrode RME4 and the second electrode RME2, respectively. The first light emitting elements ED1 and the second light emitting elements ED2 may be disposed in a way such that first ends thereof face each other in opposite directions.

The light emitting elements ED may contact the contact electrodes CNE (CNE1 through CNE3). An insulating film 38 (see FIG. 6) may not be formed on end surfaces of each light emitting element ED in the extending direction of the light emitting element ED, thereby partially exposing the semiconductor layers. The exposed semiconductor layers may contact the contact electrodes CNE. In an embodiment, a part of the insulating film 38 located on side surfaces of each light emitting element ED may be removed, and some of the contact electrodes CNE may be connected to the side surfaces of the light emitting element ED. Each light emitting element ED may be electrically connected to the first electrode RME1 or conductive layers disposed under the via layer VIA through the contact electrodes CNE and may emit light of a specific wavelength band in response to an electrical signal received thereby.

A second insulating layer PAS2 may be disposed on the light emitting elements ED. In one embodiment, for example, the second insulating layer PAS2 partially covers outer surfaces of the light emitting elements ED but does not cover the first and second ends of the light emitting elements ED. Parts of the second insulating layer PAS2 which are disposed on the light emitting elements ED extend in the first direction DR1 on the first insulating layer PAS1 to form linear or island patterns in each subpixel PXn in a plan view. The second insulating layer PAS2 may protect the light emitting elements ED while fixing the light emitting elements ED in the manufacturing process of the display device 10. In an embodiment, the second insulating layer PAS2 may fill the space between each light emitting element ED and the first insulating layer PAS1 under the light emitting element ED.

In an embodiment, the second insulating layer PAS2 may be disposed on the first bank BNL1, the second banks BNL2, and the third bank BNL3. The second insulating layer PAS2 may be disposed on the first insulating layer PAS1 but may expose opposing ends of the light emitting elements ED and partially expose parts where the electrodes RME are disposed. Such a shape of the second insulating layer PAS2 may be formed by a process of entirely forming the second insulating layer PAS2 on the first insulating layer PAS1 and then removing the second insulating layer PAS2 to expose opposing ends of the light emitting elements ED during the manufacturing process of the display device 10.

The second insulating layer PAS2 may also be partially disposed in the sub area SA. In a process of separating the electrode lines after placing the light emitting elements ED, the first insulating layer PAS1 and the second insulating layer PAS2 may also be partially removed, and a part of the via layer VIA may be exposed in the separation part ROP. A third insulating layer PAS3 may be directly disposed on the exposed part of the via layer VIA.

A plurality of contact electrodes CNE1 through CNE3 and the third insulating layer PAS3 may be disposed on the second insulating layer PAS2.

The contact electrodes CNE are disposed on the light emitting elements ED and the electrodes RME. In such an embodiment, the contact electrodes CNE are partially disposed on the second insulating layer PAS2 and may be insulated from each other by the second insulating layer PAS2 and the third insulating layer PAS3. The contact electrodes CNE may contact the light emitting elements ED and the electrodes RME. The contact electrodes CNE may directly contact the semiconductor layers exposed on opposing end surfaces of each light emitting element ED and may each contact at least any one of the electrodes RME through a contact part CT1, CT2, CT3 or CT4 defined through the first insulating layer PAS1. Opposing ends of the light emitting elements ED may be electrically connected to the electrodes RME through the contact electrodes CNE1 through CNE3.

According to an embodiment, the contact electrodes CNE of the display device 10 may be divided into different types of contact electrodes electrically connected to different types of electrodes. In one embodiment, for example, the contact electrodes CNE may include a first contact electrode CNE1 and a second contact electrode CNE2 disposed on the first electrode RME1 or the second electrode RME2.

The first contact electrode CNE1 and the second contact electrode CNE2 may be disposed on the first electrode RME1 and the second electrode RME2, respectively. Each of the first contact electrode CNE1 and the second contact electrode CNE2 may extend in the first direction DR1 and may be disposed in the emission area EMA. The first contact electrode CNE1 may be connected to the first electrode RME1 through a first contact part CT1 contacting an upper surface of the first electrode RME1, and the second contact electrode CNE2 may be connected to the second electrode RME2 through a second contact part CT2 contacting an upper surface of the second electrode RME2. In an embodiment, the first contact electrode CNE1 may contact the first ends of the first light emitting elements ED1, and the second contact electrode CNE2 may contact the second ends of the second light emitting elements ED2.

The first contact electrode CNE1 and the second contact electrode CNE2 may transfer an electrical signal transmitted to the first electrode RME1 or the second electrode RME2 to a corresponding light emitting element ED. The electrical signal may be directly transmitted to the first ends of the first light emitting elements ED1 and the second ends of the second light emitting elements ED2. The electrical signal may be applied to other contact electrodes CNE and the light emitting elements ED through the second ends of the first light emitting elements ED1 and the first ends of the second light emitting elements ED2.

The contact electrodes CNE may include a third contact electrode CNE3 disposed across the third electrode RME3 and the first electrode RME1. The third contact electrode CNE3 may be disposed on the third electrode RME3 and the fourth electrode RME4. The third contact electrode CNE3 may include a first extending part CN_E1 and a second extending part CN_E2 extending in the first direction DR1 and a plurality of first connecting parts CN_B connecting the first extending part CN_E1 and the second extending part CN_E2 to each other. The third contact electrode CNE3 may surround the first contact electrode CNE1.

The first extending part CN_E1 is disposed on the third electrode RME3, and the second extending part CN_E2 is disposed on the fourth electrode RME4. In an embodiment, the first extending part CN_E1 may be spaced apart from the second contact electrode CNE2 to face the second contact electrode CNE2, and the second extending part CN_E2 may be spaced apart from the first contact electrode CNE1 to face the first contact electrode CNE1. The first extending part CN_E1 may contact the third electrode RME3 exposed to a third contact part CT3, and the second extending part CN_E2 may contact the fourth electrode RME4 exposed to a fourth contact part CT4. The first extending part CN_E1 may contact the first ends of the second light emitting elements ED2, and the second extending part CN_E2 may contact the second ends of the first light emitting elements ED2. An electrical signal may be transmitted to each of the third electrode RME3 and the fourth electrode RME4 through the third contact electrode CNE3.

The first connecting parts CN_B may be disposed in parts of the emission area EMA in which the first bank BNL1 and the second banks BNL2 are not disposed. The first connecting parts CN_B may be respectively disposed on opposing sides of the first contact electrode CNE1 in the first direction DR1. Lengths of the first extending part CN_E1 and the second extending part CN_E2 measured in the first direction DR1 may be greater than a length of the first contact electrode CNE1, and the third contact electrode CNE3 may surround the first contact electrode CNE1 in a quadrangular shape in a plan view.

The first light emitting elements ED1 and the second light emitting elements ED2 may be electrically connected to each other through the third contact electrode CNE3. An electrical signal transmitted through the first contact electrode CNE1 may be applied to the second light emitting elements ED2 through the first light emitting elements ED1 and the third contact electrode CNE3. A plurality of light emitting elements ED disposed in one subpixel PXn may be connected in series to each other through the third contact electrode CNE3.

A part of the contact electrodes CNE in which the contact parts CT1 through CT4 are disposed may have greater widths than other parts thereof.

The contact parts CT1 through CT4 may be disposed not to overlap the light emitting elements ED in the second direction DR2. Each of the contact parts CT1 through CT4 may be spaced apart in the first direction DR1 from an area where the light emitting elements ED are disposed. Since light is emitted from opposing ends of the light emitting elements ED, the contact parts CT1 through CT4 may be positioned outside the traveling path of the light. Although the contact parts CT1 through CT4 are disposed in the emission area EMA in the drawings, the disclosure is not limited thereto. The contact parts CT1 through CT4 may be formed in the sub area SA in which the light emitting elements ED are not disposed. In such an embodiment, reflection or refraction of light emitted from the light emitting elements ED may be minimized by the contact parts CT1 through CT4 and the light emitting elements ED may be effectively prevented from clustering around the contact parts CT1 through CT4 in the manufacturing process of the display device 10 due to the contact parts CT1 through CT4 exposing upper surfaces of the electrode lines.

The contact electrodes CNE may be spaced apart from each other in the second direction DR2 in a plan view. The first contact electrode CNE1, the second contact electrode CNE2, and the extending parts CN_E1 and CN_E2 of the third contact electrode CNE3 may be spaced apart by a predetermined distance so that the first contact electrode CNE1, the second contact electrode CNE2, and the extending parts CN_E1 and CN_E2 of the third contact electrode CNE3 are not directly connected to each other. In such an embodiment, the first connecting parts CN_B of the third contact electrode CNE3 may be spaced apart from the first contact electrode CNE1 in the first direction DR1. Different contact electrodes CNE may be spaced apart from each other without being connected to each other and may be insulated from each other by the third insulting layer PAS3 disposed between them.

The contact electrodes CNE may include a conductive material such as ITO, IZO, IZTO, or aluminum (Al). In one embodiment, for example, the contact electrodes CNE may include a transparent conductive material, and light emitted from the light emitting elements ED may pass through the contact electrodes CNE and proceed toward the electrodes RME, but the disclosure is not limited thereto.

The third insulating layer PAS3 is disposed on the third contact electrode CNE3 and the second insulating layer PAS2. The third insulating layer PAS3 may be entirely disposed on the second insulating layer PAS2 to cover the third contact electrode CNE3, and the first contact electrode CNE1 and the second contact electrode CNE2 may be disposed on the third insulating layer PAS3. The third insulating layer PAS3 may be entirely disposed on the via layer VIA, except for areas in which the first contact electrode CNE1 and the second contact electrode CNE2 are disposed. In such an embodiment, the third insulating layer PAS3 may be disposed not only on the first insulating layer PAS1 and the second insulating layer PAS2 but also on the first bank BNL1, the second banks BNL2 and the third bank BNL3. The third insulating layer PAS3 may insulate the first contact electrode CNE1 and the second contact electrode CNE2 from the third contact electrode CNE3 so that the first contact electrode CNE1 and the second contact electrode CNE2 do not directly contact the third contact electrode CNE3.

In an alternative embodiment, although not illustrated in the drawings, another insulating layer may be further disposed on the first contact electrode CNE1, the second contact electrode CNE2, and the third insulating layer PAS3. The insulating layer may protect the members disposed on the first substrate SUB from the external environment.

Each of the first insulating layer PAS1, the second insulating layer PAS2, and the third insulating layer PAS3 described above may include, but is not limited to, an inorganic insulating material or an organic insulating material.

Figure 6:
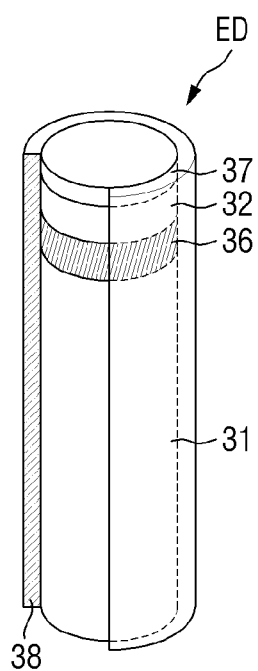
FIG. 6 is a schematic view of a light emitting element according to an embodiment.

FIG. 6 is a schematic view of a light emitting element ED according to an embodiment.

Referring to FIG. 6, an embodiment of the light emitting element ED may be a light emitting diode. In such an embodiment, the light emitting element ED may be an inorganic light emitting diode having a size of nanometers to micrometers and made of or including an inorganic material. When an electric field is formed in a specific direction between two electrodes facing each other, the light emitting element ED may be aligned between the two electrodes.

In an embodiment, the light emitting element ED may extend in one direction. The light emitting element ED may have a shape of a cylinder, a rod, a wire, a tube, or the like.

However, the shape of the light emitting element ED is not limited thereto, and alternatively, the light emitting element ED may have one of other various shapes including polygonal prisms, such as a cube, a rectangular parallelepiped and a hexagonal prism, and a shape extending in a direction with a partially inclined outer surface.

The light emitting element ED may include a semiconductor layer doped with impurities of any conductivity type (e.g., a p type or an n type). The semiconductor layer may receive an electrical signal from an external power source and emit light of a specific wavelength band. In an embodiment, as shown in FIG. 6, the light emitting element ED may include a first semiconductor layer 31, a second semiconductor layer 32, a light emitting layer 36, an electrode layer 37, and the insulating film 38.

The first semiconductor layer 31 may be an n-type semiconductor. In an embodiment, the first semiconductor layer 31 may include a semiconductor material having a chemical formula of $Al_xGa_yIn_{1-x-y}N$ ($0 \le x \le 1$, $0 \le y \le 1$, $0 \le x+y \le 1$). In one embodiment, for example, the first semiconductor layer 31 may include at least one selected from n-type doped AlGaInN, n-type doped GaN, n-type doped AlGaN, n-type doped InGaN, n-type doped AlN, and n-type doped InN. An n-type dopant used to dope the first semiconductor layer 31 may be Si, Ge, Sn, or the like.

The second semiconductor layer 32 is disposed on the first semiconductor layer 31 with the light emitting layer 36 interposed between them. The second semiconductor layer 32 may be a p-type semiconductor. In an embodiment, the second semiconductor layer 32 may include a semiconductor material having a chemical formula of $Al_xGa_yIn_{1-x-y}N$ ($0 \le x \le 1$, $0 \le y \le 1$, $0 \le x+y \le 1$). In one embodiment, for example, the second semiconductor layer 32 may include at least one selected from p-type doped AlGaInN, p-type doped GaN, p-type doped AlGaN, p-type doped InGaN, p-type doped AlN, and p-type doped InN. A p-type dopant used to dope the second semiconductor layer 32 may be Mg, Zn, Ca, Se, Ba, or the like.

In an embodiment, each of the first semiconductor layer 31 and the second semiconductor layer 32 may have a single layer structure as shown in FIG. 6, but the disclosure is not limited thereto. Alternatively, each of the first semiconductor layer 31 and the second semiconductor layer 32 may have a multilayer structure, for example, may further include a clad layer or a tensile strain barrier reducing ("TSBR") layer depending on the material of the light emitting layer 36.

The light emitting layer 36 is disposed between the first semiconductor layer 31 and the second semiconductor layer 32. The light emitting layer 36 may include a material having a single or multiple quantum well structure. In an embodiment where the light emitting layer 36 includes a material having a multiple quantum well structure, the light emitting layer 36 may have a structure in which a plurality of quantum layers and a plurality of well are alternately stacked. The light emitting layer 36 may emit light through combination of electron-hole pairs based on an electrical signal received through the first semiconductor layer 31 and the second semiconductor layer 32. In an embodiment, the light emitting layer 36 may include a material such as AlGaN or AlGaInN. In an embodiment, where the light emitting layer 36 has a multiple quantum well structure in which a quantum layer and a well layer are alternately stacked, the quantum layer may include a material such as AlGaN or AlGaInN, and the well layer may include a material such as GaN or AlInN.

In an embodiment, the light emitting layer 36 may have a structure in which a semiconductor material having a large band gap energy and a semiconductor material having a small band gap energy are alternately stacked or may include different group 3 to 5 semiconductor materials depending on the wavelength band of light to emit. In an embodiment, light emitted from the light emitting layer 36 may be in a blue wavelength band. In an alternative embodiment, the light emitting layer 36 may emit light in a red or green wavelength band.

The electrode layer 37 may be an ohmic contact electrode. However, the disclosure is not limited thereto, and the electrode layer 37 may be a Schottky contact electrode. The light emitting element ED may include at least one electrode layer 37. The light emitting element ED may include one or more electrode layers 37, but the disclosure is not limited thereto, and alternatively, the electrode layer 37 may be omitted.

When the light emitting element ED is electrically connected to an electrode or a contact electrode in the display device 10, the electrode layer 37 may reduce the resistance between the light emitting element ED and the electrode or the contact electrode. The electrode layer 37 may include a conductive metal. In one embodiment, for example, the electrode layer 37 may include at least one selected from aluminum (Al), titanium (Ti), indium (In), gold (Au), silver (Ag), ITO, IZO, and IZTO.

The insulating film 38 surrounds outer surfaces of the semiconductor layers and the electrode layer described above. In one embodiment, for example, the insulating film 38 may surround an outer surface of at least the light emitting layer 36 but may expose opposing ends of the light emitting element ED in a longitudinal direction. In an embodiment, an upper surface of the insulating film 38 may be rounded in cross section in an area adjacent to at least one end of the light emitting element ED.

The insulating film 38 may include a material having insulating properties, such as silicon oxide ($SiO_x$), silicon nitride ($SiN_x$), silicon oxynitride ($SiO_xN_y$), aluminum nitride ($AlN_x$), or aluminum oxide ($AlO_x$). In an embodiment, the insulating film 38 may have a single layer structure as shown in FIG. 6, the disclosure is not limited thereto. In an alternative embodiment, the insulating film 38 may have a multilayer structure in which a plurality of layers are stacked one on another.

The insulating film 38 may protect the elements described above. The insulating film 38 may prevent an electrical short circuit that may occur in the light emitting layer 36 when the light emitting layer 36 directly contacts an electrode through which an electrical signal is transmitted to the light emitting element ED. In an embodiment, the insulating film 38 may prevent a reduction in luminous efficiency of the light emitting element ED.

In an embodiment, an outer surface of the insulating film 38 may be treated. A plurality of light emitting elements ED may be sprayed onto electrodes in a state where the light emitting elements ED are dispersed in a predetermined ink and then may be aligned. Here, the surface of the insulating film 38 may be hydrophobic or hydrophilic-treated such that each light emitting element ED remains separate from other adjacent light emitting elements ED in the ink without being agglomerated with them.

The light emitting element ED including the first semiconductor layer 31 and the second semiconductor layer 32 doped with different conductivity types may be oriented by an electric field such that one end thereof faces a specific direction. The display device 10 may generate an electric field by transmitting alignment signals to electrode lines RM1 through RM4 (see FIG. 7), thereby aligning the light emitting elements ED.

Figure 7:
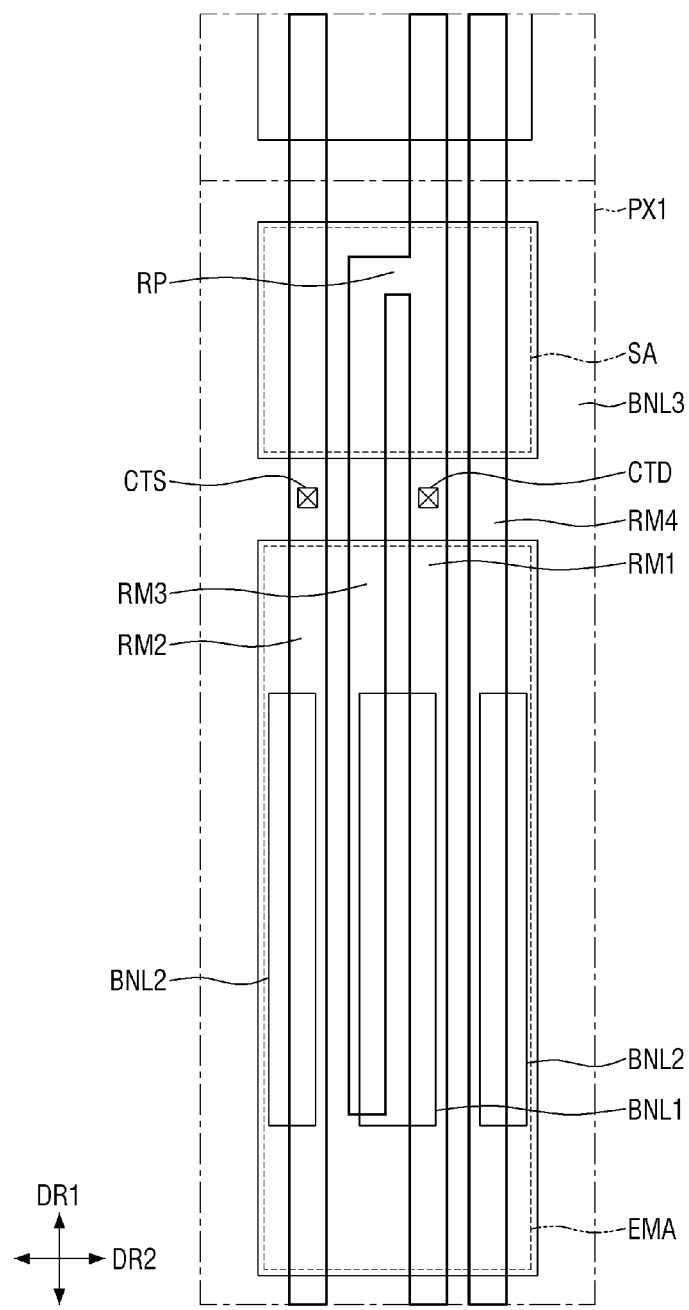
FIGS. 7 through 9 are cross-sectional views sequentially illustrating some operations in a process of manufacturing the display device according to an embodiment.
Figure 8:
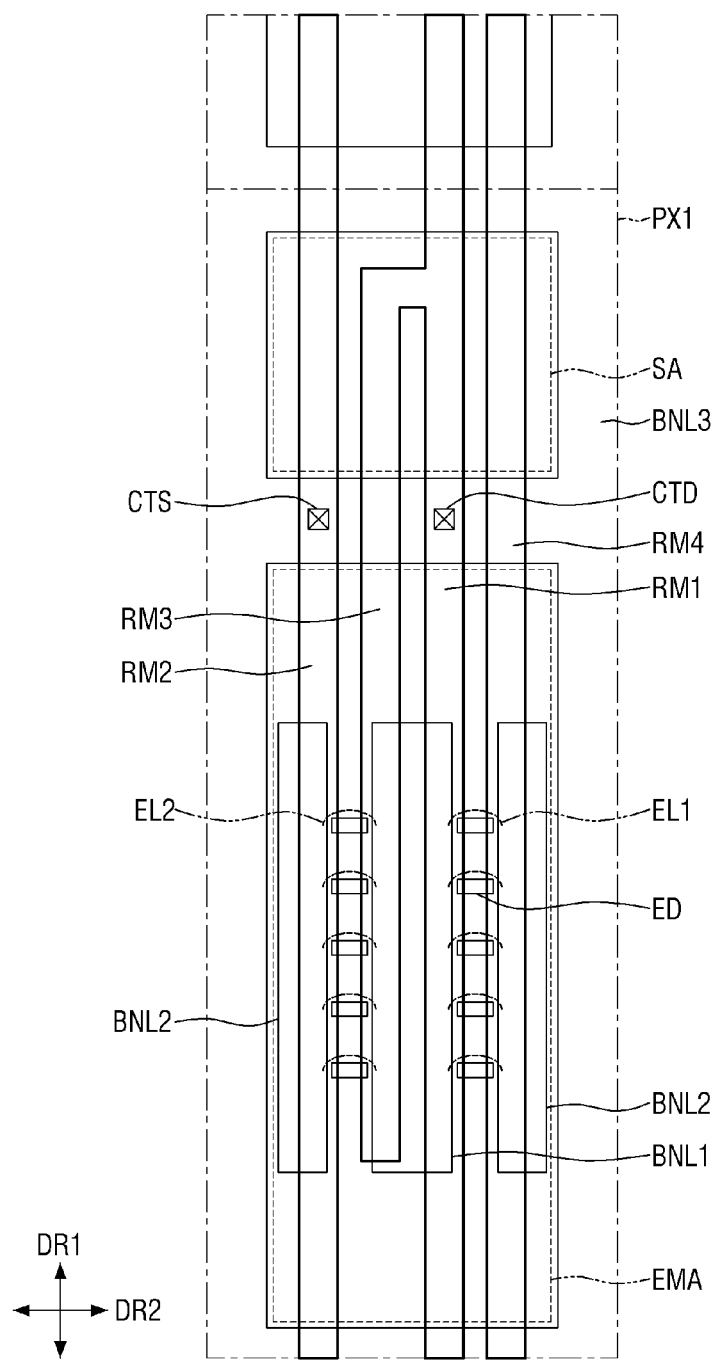
Figure 9:
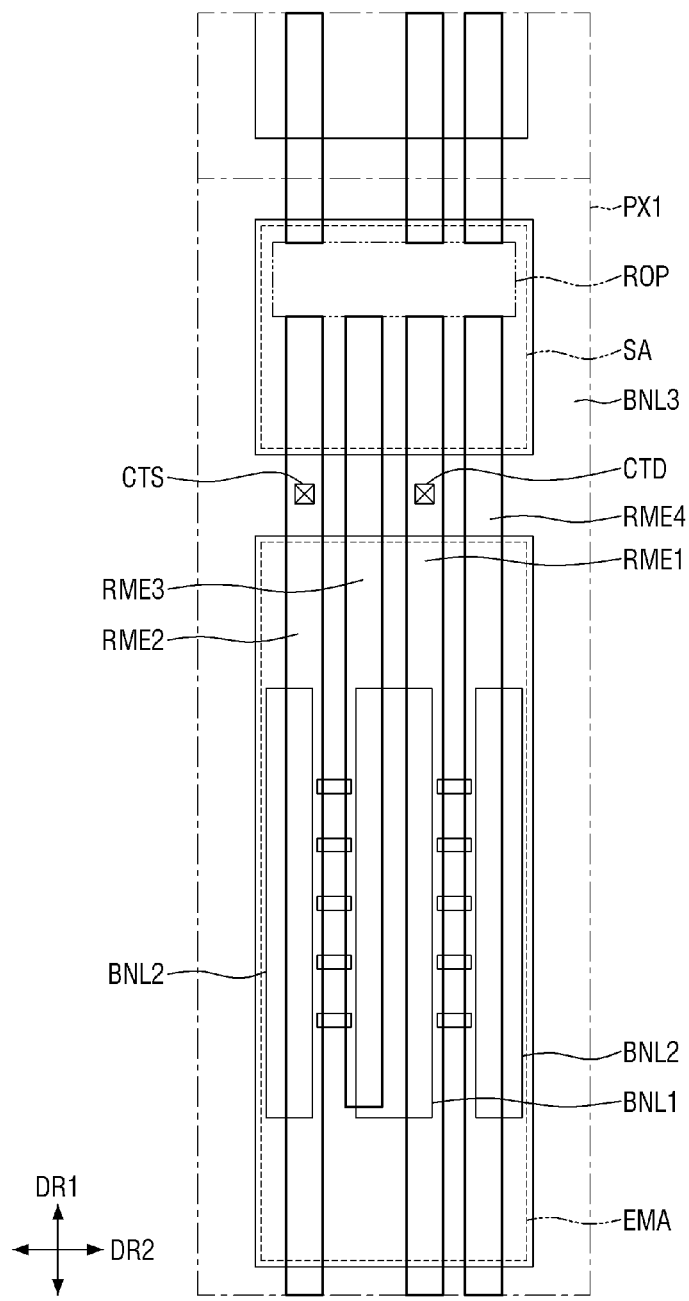

FIGS. 7 through 9 are cross-sectional views sequentially illustrating some operations in a process of manufacturing the display device 10 according to an embodiment. FIGS. 7 through 9 illustrate a process of placing the light emitting elements ED on a plurality of electrode lines RM1 through RM4 and separating (or disconnecting) the electrode lines RM1 through RM4 to form the electrodes RME.

First, referring to FIG. 7, in an embodiment of the manufacturing process of the display device 10, a plurality of electrode lines RM1 through RM4 are provided or formed to place the light emitting elements ED. The electrode lines RM1 through RM4 are electrode lines from which the electrodes RME described above originate and may be entirely disposed in the display area DPA.

The electrode lines RM1 through RM4 include a first electrode line WI, a second electrode line RM2, a third electrode line RM3, and a fourth electrode line RM4 defined by portions of the electrodes RME, respectively. The first electrode line RM1 may be separated in the sub area SA to form the first electrode RME1, the second electrode line RM2 may be separated in the sub area SA to form the second electrode RME2, the third electrode line RM2 may be separated in the sub area SA to form the third electrode RME3, and the fourth electrode line RM4 may be separated in the sub area SA to form the fourth electrode RME4.

The first electrode line RM1, the second electrode line RM2 and the fourth electrode line RM4, which are first type electrode lines extend in the first direction DR1, across a plurality of subpixels PXn. The first type electrode lines may be disposed across the emission area EMA and the sub area SA and may extend to other subpixels PXn neighboring in the first direction DR1. One first type electrode line may be disposed in the display area DPA across a plurality of subpixels PXn arranged in the first direction DR1.

The third electrode line RM3, which is a second type electrode line, may be disposed in each subpixel PXn. The second type electrode line may be disposed across the emission area EMA and the sub area SA of a corresponding subpixel PXn and may be connected to a first type electrode line through a routing part RP.

In one embodiment, for example, the first electrode line RM1 which is a first type electrode line may neighbor the third electrode line RM3 which is a second type electrode line, and the third electrode line RM3 may be integrally formed with the first electrode line RM1 and the routing part RP disposed in the sub area SA as a single unitary unit. The first electrode line RM1 may extend in the first direction DR1 in the entire display area DPA, and a plurality of third electrode lines RM3 may branch from the first electrode line Mill through the routing parts RP in the sub areas SA. In such an embodiment, in the entire display area. DPA, three electrode lines, that is, the first electrode line RM1, the second electrode line RM2 and the fourth electrode line RM4 extend in the first direction DR1, and the third electrode lines RM3 branch from the first electrode line IWI. Accordingly, although four electrode lines are disposed in the emission area EMA and the sub area SA of each subpixel PXn, only three electrode lines may be disposed at the boundary between the subpixels PXn.

Such connection between the first electrode line RM1 and the third electrode line RM3 may prevent the light emitting elements ED from being disposed in an unwanted area by an electric field generated therebetween in an alignment process of the light emitting elements ED.

Referring to FIG. 8, the light emitting elements ED are placed on the electrode lines RM1 through RM4 by transmitting alignment signals to the electrode lines RM1 through RM4. Electric fields EL1 and EL2 may be generated between the electrode lines RM1 through RM4 to which different alignment signals are transmitted. In an embodiment, a first alignment signal may be transmitted to the first electrode line RM1 and the third electrode line RM3, and a second alignment signal different from the first alignment signal may be transmitted to the second electrode line RM2 and the fourth electrode line RM4. Accordingly, a first electric field EL1 may be generated between the first electrode line RM1 and the fourth electrode line RM4, and a second electric field EL2 may be generated between the second electrode line RM2 and the third electrode line RM3. When the electric fields EL1 and EL2 are generated after the light emitting elements ED are sprayed to the emission area EMA, the light emitting elements ED may be placed on the electrode lines RM1 through RM4 as orientation directions and positions thereof are changed by the force of the electric fields EL1 and EL2.

In an embodiment, as described above with reference to FIG. 3, the display device 10 may emit light by connecting the light emitting elements ED disposed on the first electrode RME1 and the fourth electrode RME4 and on the second electrode RME2 and the third electrode RME3 through the contact electrodes CNE. According to the design of the electrodes RME and the contact electrodes CNE, the light emitting elements ED are desired to be intensively disposed between the electrodes or between the first bank BNL1 and the second banks BNL2 in the emission area EMA. In such an embodiment, the connection structure of the electrode lines RM1 through RM4 which generate the electric fields EL1 and EL2 may be designed as illustrated in FIGS. 7 and 8 to minimize the number of light emitting elements ED disposed in other areas, that is, the number of 'misplaced light emitting elements ED' in the display device 10.

Since the third electrode line RM3 is integrally formed with the first electrode line RM1 and the routing part RP, a same first alignment signal may be transmitted to the first electrode line RM1 and the third electrode line RM3. A potential difference may hardly occur between the first electrode line RM1 and the third electrode line RM3, and no electric field or only a very weak electric field may be generated therebetween. Since the electric fields EL1 and EL2 generated in the emission area EMA are generated mostly between the first electrode line RM1 and the fourth electrode line RM4 and between the second electrode line RM2 and the third electrode line 1643, the light emitting elements ED may be hardly disposed on the first electrode line RM1 and the third electrode line RM3. In such an embodiment, since a second type electrode line such as the third electrode line RM3 is designed in the display device 10, the electric fields EL1 and EL2 may be locally generated in desired areas, and the light emitting elements ED may be intensively placed in desired areas. Thus, misplacement of the light emitting elements ED may be minimized. In such an embodiment, since the first electrode line RM1 and the third electrode line RM3 are integrally formed with each other as a single unitary unit, an alignment signal control for suppressing generation of an electric field therebetween may be omitted.

Next, referring to FIG. 9, the electrode lines RM1 through RM4 are separated in the separation part ROP of the sub area SA to form the electrodes RME (RME1 through RME4). The first electrode line RM1 and the third electrode line RM3 may be separated in the separation part ROP together with the routing part RP to form the first electrode RME1 and the third electrode RME3, respectively. The second electrode line RM2 and the fourth electrode line RM4 may be separated in the separation part ROP to form the second electrode RME2 and the fourth electrode RME4, respectively.

In such an embodiment, as described above, since the third electrode line 1643 branches from the first electrode line RM1 through the routing part RP, the number of electrodes RME formed by separation in the separation part ROP may be four in the emission area EMA but may be three at the boundary between subpixels PXn neighboring in the first direction DR1. In an embodiment of the display device 10, the electrodes RME may be disposed in a structure corresponding to the design of the electrode lines for minimizing misplacement of the light emitting elements ED.

Figure 10:
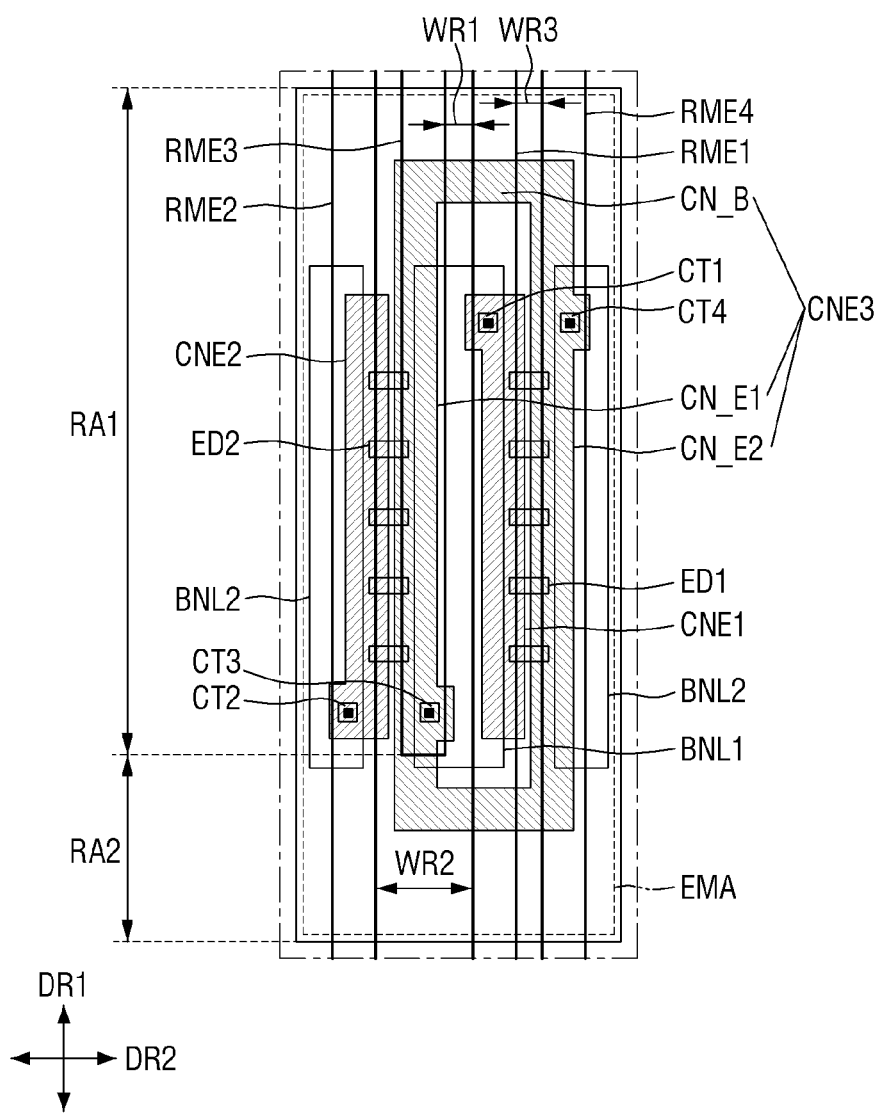
FIG. 10 illustrates parts of electrodes disposed in an emission area of the subpixel of FIG. 3.
Figure 11:
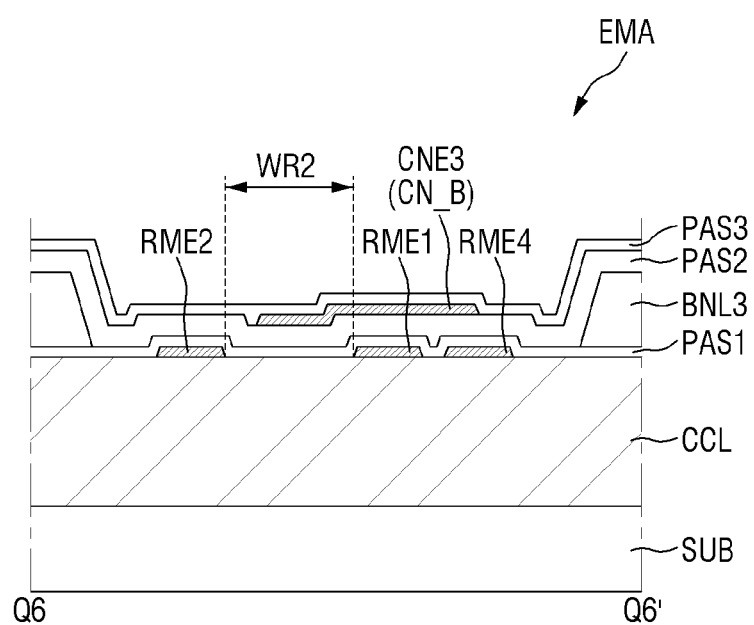
FIG. 11 is a cross-sectional view taken along line Q6-Q6' of FIG. 3.
Figure 12:
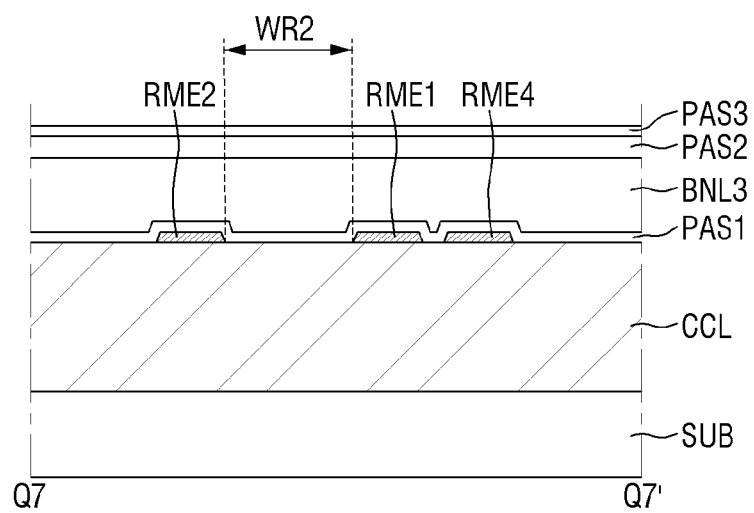
FIG. 12 is a cross-sectional view taken along line Q7-Q7' of FIG. 3.

FIG. 10 illustrates parts of the electrodes RME disposed in the emission area EMA of the subpixel PXn of FIG. 3. FIG. 11 is a cross-sectional view taken along line Q6-Q6' of FIG. 3. FIG. 12 is a cross-sectional view taken along line Q7-Q7' of FIG. 3. FIG. 11 illustrates a cross section across a part in which the electrodes RME are disposed in the emission area EMA, and FIG. 12 illustrates a cross section across a part in which the electrodes RME are disposed at the boundary of the subpixel PXn.

Referring to FIGS. 10 through 12 in conjunction with FIGS. 3 and 4, the electrodes RME may be divided into different types of electrodes according to types of electrode lines. In one embodiment, for example, the first electrode RME1, the second electrode RME2 and the fourth electrode RME4 disposed at the boundary with another subpixel PXn as well as in the emission area EMA and the sub area SA may be first type electrodes, and the third electrode RME3 not disposed at the boundary with another subpixel PXn may be a second type electrode. The first type electrodes may extend in the first direction DR1 from the separation part ROP located in the sub area SA of a corresponding subpixel PXn to the separation part ROP located in the sub area SA of another neighboring subpixel PXn. In such an embodiment, the first type electrodes may be disposed across one emission area EMA and two sub areas SA. In such an embodiment, the second type electrode may extend in the first direction DR1 from the separation part ROP located in the sub area SA of a corresponding subpixel PXn to the emission area EMA of the corresponding subpixel PXn. An end of the second type electrode in the first direction DR1 may be disposed in the sub area SA, and the other end of the second type electrode in the first direction DR1 may be disposed in the emission area EMA. Accordingly, lengths of the first and second type electrodes in the first direction DR1 may be different from each other. In an embodiment of the display device 10, lengths, in the first direction DR1, of the first electrode RME1, the second electrode RME2 and the fourth electrode RME4 which are first type electrodes may be greater than a length, in the first direction DR1, of the third electrode RME3 which is a second type electrode.

In an embodiment, the emission area. EMA, which is defined by an opening area surrounded by the third bank BNL3, may be divided into a first portion RA1 in which the third electrode RME3 is disposed and a second portion RA2 in which the third electrode RME3 is not disposed. The first portion RA1 is a part in which the third electrode RME3 and the light emitting elements ED are disposed, and four electrodes RME may be disposed and spaced apart by a predetermined distance in the second direction DR2. The first electrode RME1 and the third electrode RME3 disposed on a side of the first electrode RME1 in the second direction DR2 may be spaced apart from each other by a first distance WR1. In such an embodiment, the first electrode RME1 and the fourth electrode RME4 as well as the second electrode RME2 and the third electrode RME3 may be spaced apart from each other by a third distance WR3.

In such an embodiment, in the second portion RA2 of the emission area EMA and at the boundary between the subpixels PXn as illustrated in FIG. 12, the third electrode RME3 and the light emitting elements ED may not be disposed, and three electrodes RME may be disposed and spaced apart in the second direction DR2. The first electrode RME1 and the second electrode RME2 disposed on a side of the first electrode RME1 in the second direction DR2 may be spaced apart from each other by a second distance WR2, and the first electrode RME1 and the fourth electrode RME4 may be spaced apart from each other by the third distance WR3. In such an embodiment, since the third electrode RME3 is not disposed in the second portion RA2, a distance between the first electrode RME1 and electrodes disposed on both sides of the first electrode RME1 in the second portion RA2 may be different from that in the first portion RA1.

The second distance WR2 between the first electrode RME1 and another electrode (e.g., the second electrode) disposed on a side of the first electrode RME1 in the second direction DR2 in the second portion RA2 of the emission area EMA may be greater than the first distance WR1 between the first electrode RME1 and another electrode (e.g., the third electrode) disposed on the side of the first electrode RME1 in the second direction DR2 in the first portion RA1 (i.e., WR2>WR1). Accordingly, if the third distance WR3 between the first electrode RME1 and the fourth electrode RME4 is constant, an average distance between electrodes spaced apart the second direction DR2 may be different n the first portion RA1 and the second portion RA2.

According to an embodiment, the display device 10 may include parts in which the average distance between the electrodes RME spaced apart in the second direction DR2 is different. In the first portion RA1 of the emission area EMA, four electrodes may be disposed, and the average distance therebetween may be calculated as '(2×WR3+WR1)/3'. In such an embodiment, in the second portion RA2 of the emission area EMA and at the boundary between the subpixels PXn, three electrodes may be disposed, and the average distance therebetween may be calculated as '(WR2+WR3)/2'. The second distance WR2 is substantially equal to the sum of the first distance WR1, the third distance WR3, and a width of the third electrode RME3. Therefore, the average distance between the electrodes RME may be greater in the second portion RA2 than in the first portion RA1.

As the distance between the electrodes RME increases, a short circuit between the electrodes RME in the manufacturing process of the display device 10 may be effectively prevented. Since the electrodes RME are spaced apart by a sufficient distance, materials of neighboring electrode lines are prevented from being connected to each other to short-circuit when the electrode lines are formed. In such an embodiment, when the electrode lines are separated in the separation part ROP, the probability of short-circuit occurrence between neighboring electrodes to residues of a material not completely removed may be substantially low. In an embodiment of the display device 10 according to the invention, misplacement of the light emitting elements ED may be minimized through connection of electrode lines and structural design of the electrodes RME. In such an embodiment, the short circuit problem between neighboring electrodes during the formation and separation process of the electrode lines may be effectively prevented.

Various embodiments of the display device 10 will now be described with FIGS. 13 to 25.

Figure 13:
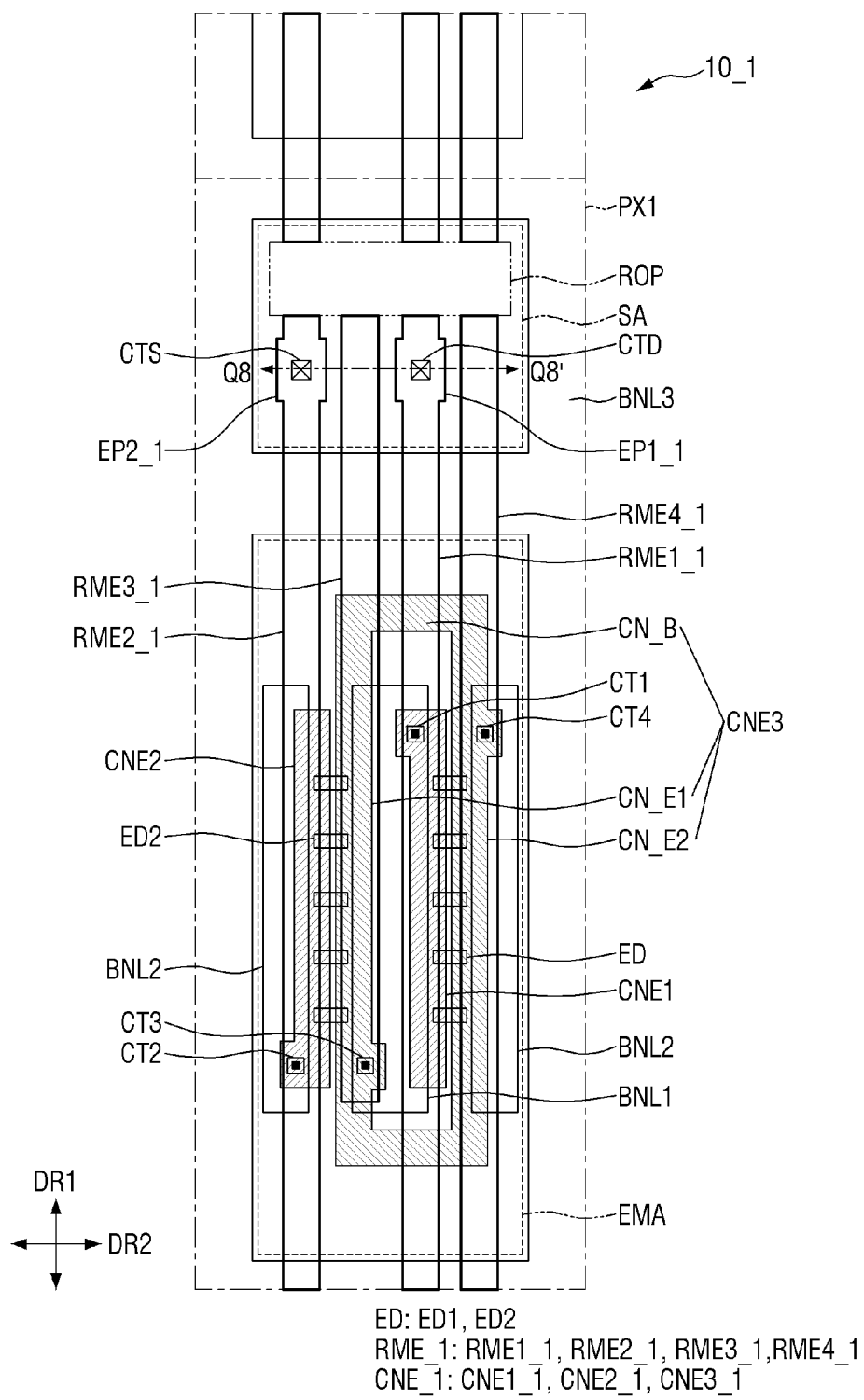
FIG. 13 is a plan view of a subpixel of a display device according to an embodiment.
Figure 14:
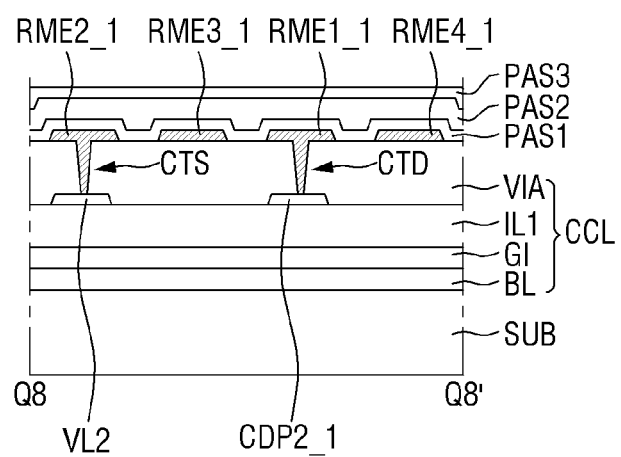
FIG. 14 is a cross-sectional view taken along line Q8-Q8' of FIG. 13.

FIG. 13 is a plan view of a subpixel of a display device 10_1 according to an embodiment. FIG. 14 is a cross-sectional view taken along line Q8-Q8' of FIG. 13. FIG. 14 illustrates a cross section across a plurality of electrodes RME disposed in a sub area SA.

Referring to FIGS. 13 and 14, in the display device 10_1, electrode contact holes CTD and CTS through which a first electrode RME1_1 and a second electrode RME2_1 among the electrodes RME1_1 to RME 4_1 are connected to a conductive layer thereunder may be formed at a different position. According to an embodiment, the first electrode RME1_1 and the second electrode RME2_1 of the display device 10_1 may further include electrode expansion parts EP1_1 and EP2_1 having a relatively large width in the sub area SA, and the electrode contact holes CTD and CTS may be located in the sub area SA.

The first electrode RME1_1 may include a first electrode expansion part EP1_1 disposed in the sub area SA and having a greater width than other parts. The second electrode RME2_1 may also include a second electrode expansion part EP2_1 disposed in the sub area SA and having a greater width than other parts. The first electrode expansion part EP1_1 of the first electrode RME1_1 may contact a second conductive pattern CDP2_1 through a first electrode contact hole CTD defined through a via layer VIA thereunder. The second electrode expansion part EP2_1 of the second electrode RME2_1 may contact a second voltage line VL2 through a second electrode contact hole CTS defined through the via layer VIA thereunder.

An embodiment of the display device 10_1 shown in FIGS. 13 and 14 is substantially the same as the embodiment of FIG. 3 except for the formation position of the first electrode contact hole CTD and the second electrode contact hole CTS. The first electrode contact hole CTD and the second electrode contact hole CTS are parts through which the first electrode RME1_1 and the second electrode RME2_1 are connected to a third conductive layer thereunder. In such an embodiment of the manufacturing process of the display device 10, an electric field is generated by alignment signals transmitted to electrode lines. Here, the intensity of the electric field may vary according to position due to parts of the electrode lines which are connected to a conductive layer thereunder through the electrode contact holes CTD and CTS. When the intensity of the electric field varies according to position in an emission area EMA, light emitting elements ED may be intensively disposed in a specific position, in such an embodiment, the number of light emitting elements ED disposed in an unwanted area may be increased, thereby increasing a misplacement rate. Accordingly, in such an embodiment the display device 10_1, the electrode contact holes CTD and CTS may be disposed in the sub area SA in which the light emitting elements ED are not disposed.

Figure 15:
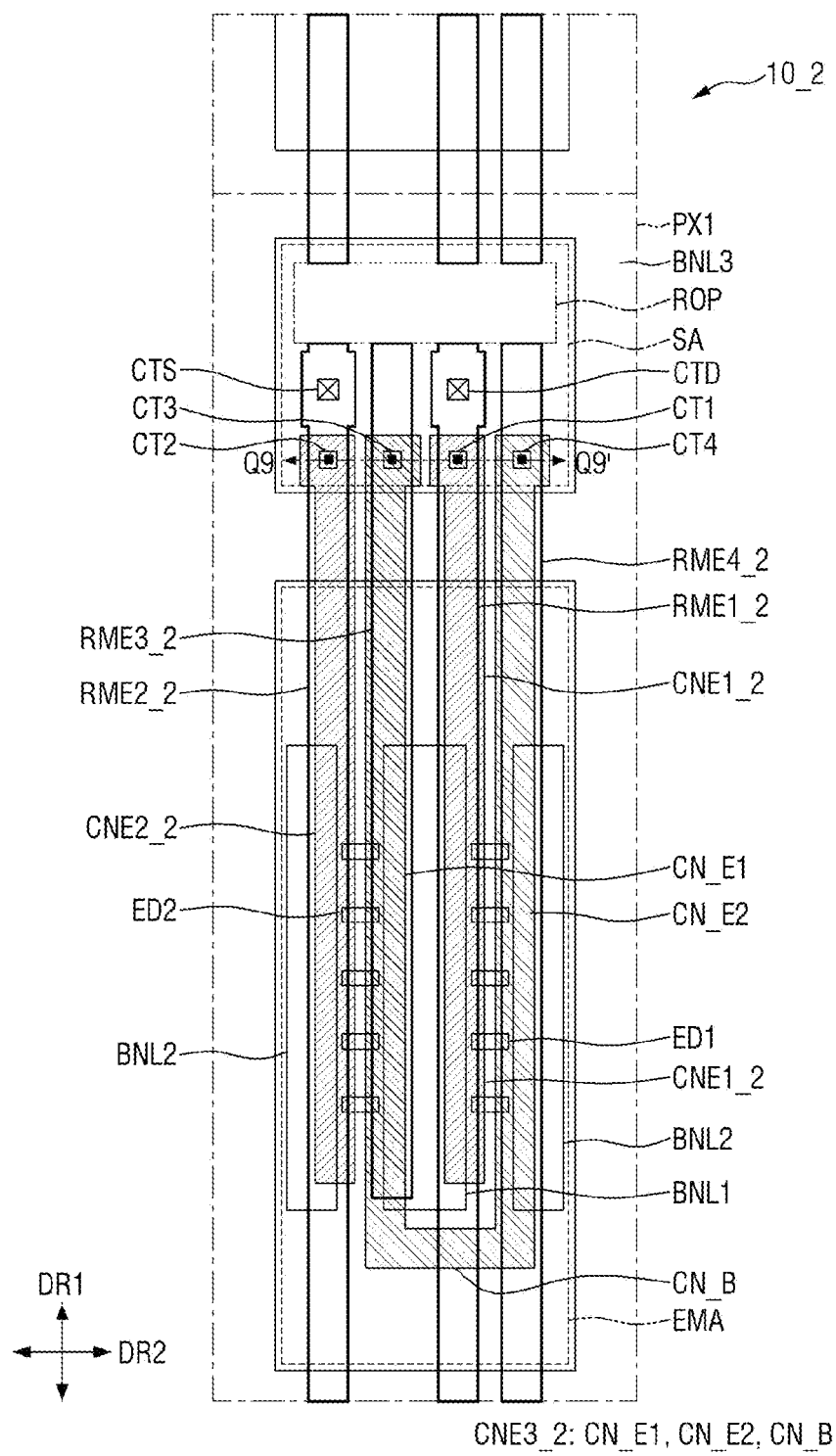
FIG. 15 is a plan view of a subpixel of a display device according to an embodiment.
Figure 16:
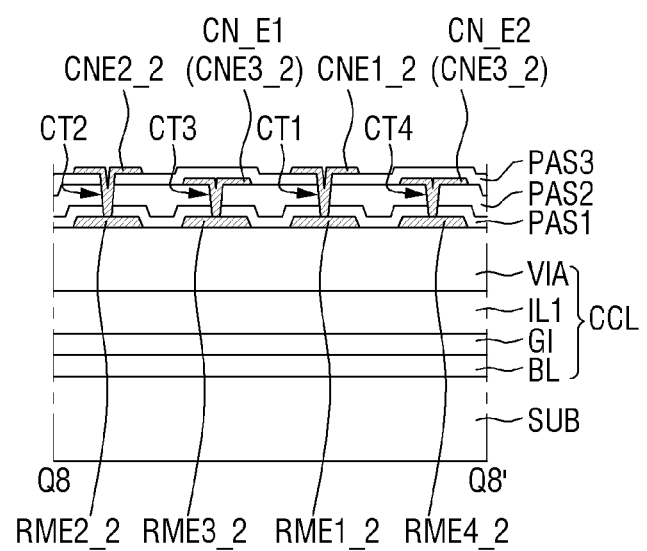
FIG. 16 is a cross-sectional view taken along line Q9-Q9' of FIG. 15.

FIG. 15 is a plan view of a subpixel of a display device 10_2 according to an embodiment. FIG. 16 is a cross-sectional view taken along line Q9-Q9' of FIG. 15.

Referring to FIGS. 15 and 16, in an embodiment of the display device 10_2, positions of contact parts CT1 through CT4 through which a plurality of electrodes RME_2 and a plurality of contact electrodes CNE_2 are connected may be different from those of the embodiments described above.

According to an embodiment, the contact electrodes CNE_2 of the display device 10_2 may be disposed across an emission area EMA and a sub area SA, and the contact parts CT1 through CT4 may be located in the sub area SA.

A first contact electrode CNE1_2 and a second contact electrode CNE2_2 may each extend in the first direction DR1 from the emission area EMA up to before a separation part ROP of the sub area SA. The first contact electrode CNE1_2 may contact a first electrode RME1_2 through a first contact part CT1 located in the sub area SA, and the second contact electrode CNE2_2 may contact a second electrode RME2_2 through a second contact part CT2 located in the sub area SA.

In a third contact electrode CNE3_2, a first extending part CN_E1 and a second extending part CN_E2 may each extend in the first direction DR1 from the emission area EMA up to before the separation part ROP of the sub area SA. The first extending part CN_E1 and the second extending part CN_E2 of the third contact electrode CNE3_2 may contact a third electrode RME3_2 and a fourth electrode RME4_2 through a third contact part CT3 and a fourth contact part CT4 located in the sub area SA, respectively.

A first connecting part CN_B of the third contact electrode CNE3_2 may connect the first extending part CN_E1 and the second extending part CN_E2 in the emission area EMA but may be disposed on only one side of the first contact electrode CNE1_2 in the first direction DR1, unlike in the embodiment of FIG. 3.

A second insulating layer PAS2 may be entirely disposed in the sub area SA except for the separation part ROP and a third insulating layer PAS3 may be entirely disposed in the sub area SA regardless of the separation part ROP. Unlike in the embodiment of FIG. 3, the contact parts CT1 through CT4 may be disposed in the sub area SA and may be disposed through insulating layers disposed on a first insulating layer PAS1 in addition to the first insulating layer PAS1. In one embodiment, for example, the first contact part CT1 and the second contact part CT2 may be disposed through the second insulating layer PAS2 and the third insulating layer PAS3 in addition to the first insulating layer PAS1 and the third contact part CT3 and the fourth contact part CT4 may be disposed through the first insulating layer PAS1 and the second insulating layer PAS2.

The contact parts CT1 through CT4 may be disposed in the sub area SA outside the emission area EMA, such that light emitted from light emitting elements ED may be prevented from not being output by being refracted by the contact parts CT1 through CT4. In such an embodiment, the light emitting elements ED may be effectively prevented from clustering around the contact parts CT1 through CT4 in the manufacturing process of the display device 10 due to the contact parts CT1 through CT4 exposing upper surfaces of the electrodes RME.

Figure 17:
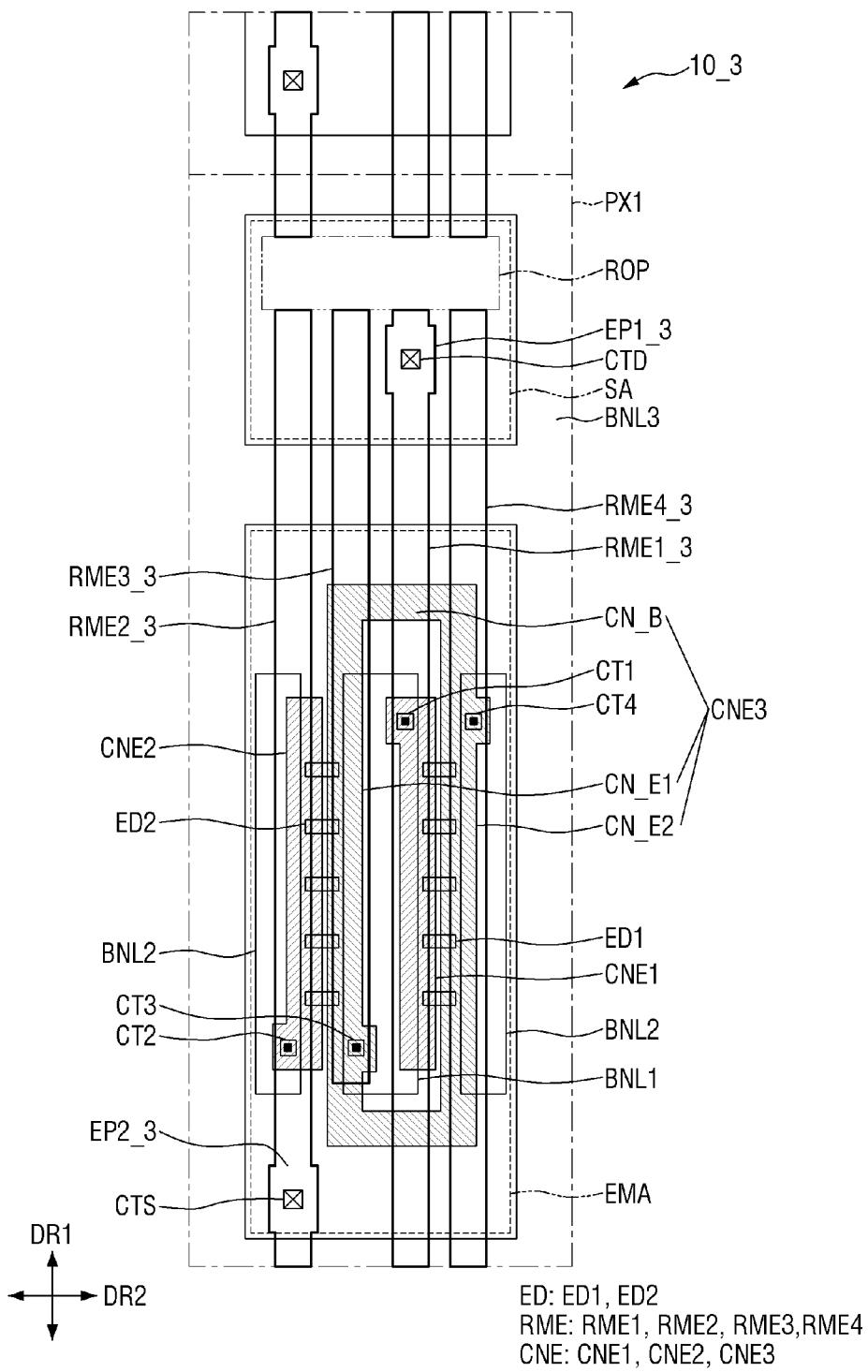
FIG. 17 is a plan view of a subpixel of a display device according to an embodiment.

FIG. 17 is a plan view of a subpixel of a display device 10_3 according to an embodiment.

Referring to FIG. 17, in an embodiment of the display device 10_, a first electrode expansion part EP1_3 of a first electrode RME1_3 may be disposed in a sub area SA, and a second electrode expansion part EP2_3 of a second electrode RME2_3 may be disposed in an emission area EMA. In such an embodiment, a third electrode RME3_3 and a fourth electrode RME4_3 may not include an electrode expansion part. In an embodiment, as described above with reference to FIGS. 3 and 13, positions of electrode contact holes CTD and CTS through which the first electrode RME1_3 and the second electrode RME2_3 are connected to a conductive layer under a via layer VIA may be variously modified. Accordingly, the positions of the electrode contact holes CTD and CTS may be variously changed according to the arrangement design of conductive layers under the via layer VIA and electrodes RME in consideration of the intensity of an electric field generated by alignment signals in parts where the electrode contact holes CTD and CTS are located.

In an embodiment of the display device 10_3 of FIG. 17, the first electrode expansion part EP1_3 of the first electrode RME1_3 may be disposed in the sub area SA, and a first electrode contact hole CTD may also be disposed in the sub area SA. In such an embodiment, the second electrode expansion part EP2_3 of the second electrode RME2_3 may be disposed in the emission area EMA, and a second electrode contact hole CTS may also be disposed in the emission area EMA. In such an embodiment, the second electrode expansion part EP2_3 and the second electrode contact hole CTS may be spaced as far apart as possible from an area where the light emitting elements ED are disposed to minimize the misplacement rate of light emitting elements ED. As illustrated in FIG. 17, the second electrode expansion part EP2_3 of the second electrode RME2_3 may be spaced apart from a second bank BNL2 in the first direction DR1 and may minimize a change in the intensity of an electric field due to the second electrode contact hole CTS. In such an embodiment of the display device 10_3, the structural design of the electrodes RME on the via layer VIA and the arrangement design of the conductive layers under the via layer may be changed relatively freely.

In an embodiment of the display device 10, misplacement of the light emitting elements ED may be minimized by designing a connection structure of electrode lines utilized to align the light emitting elements ED. In such an embodiment of the display device 10, the arrangement and structure of the electrode lines may be designed differently from those in FIG. 3 to intensively place the light emitting elements ED at a specific position and to further minimize the misplacement rate. In an embodiment, the display device 10 may have a structure in which a plurality of electrodes RIME extend with a non-uniform width and include alignment parts partially bent or having a large width.

Figure 18:
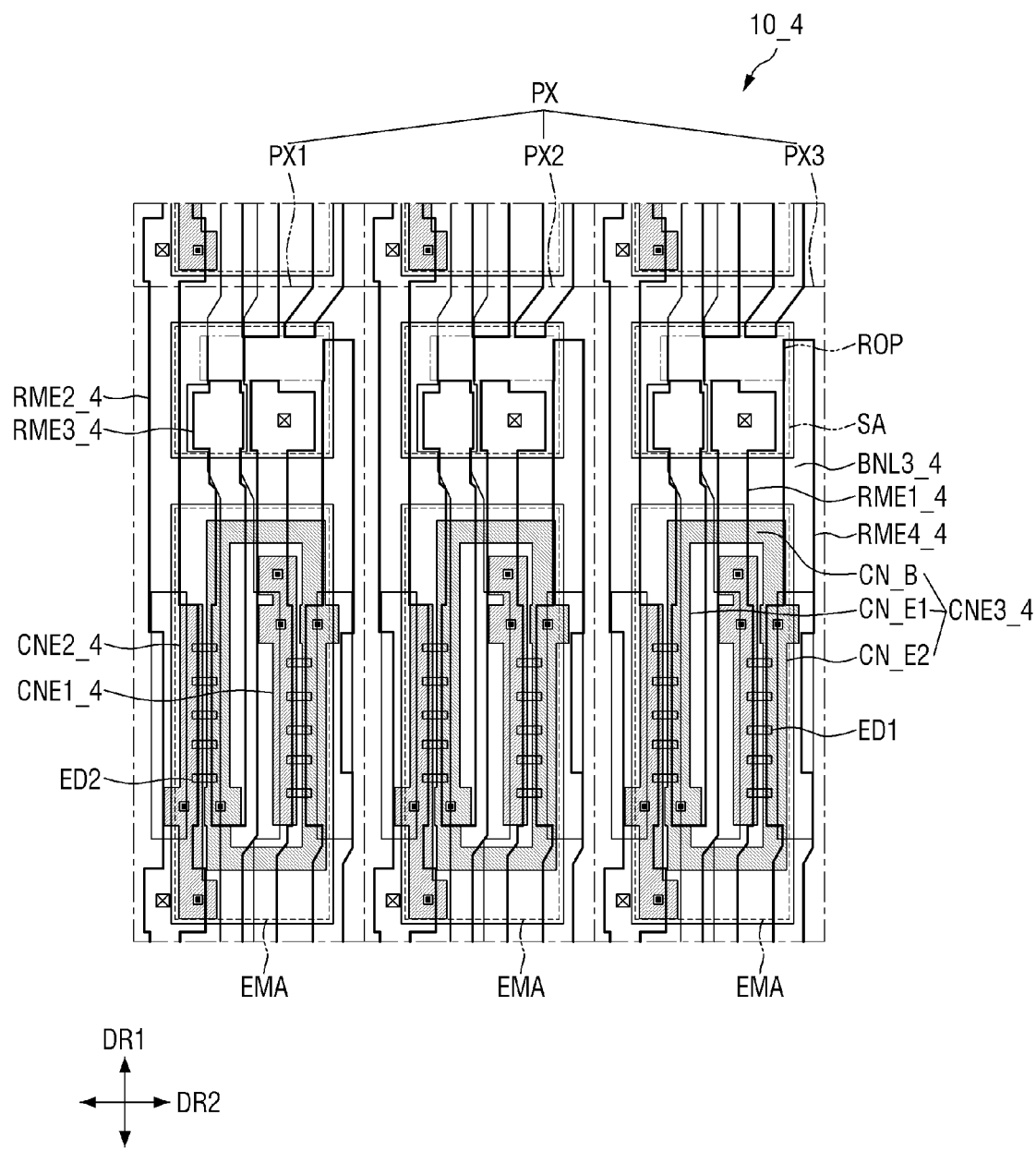
FIG. 18 is a plan view of a pixel of a display device according to an embodiment.
Figure 19:
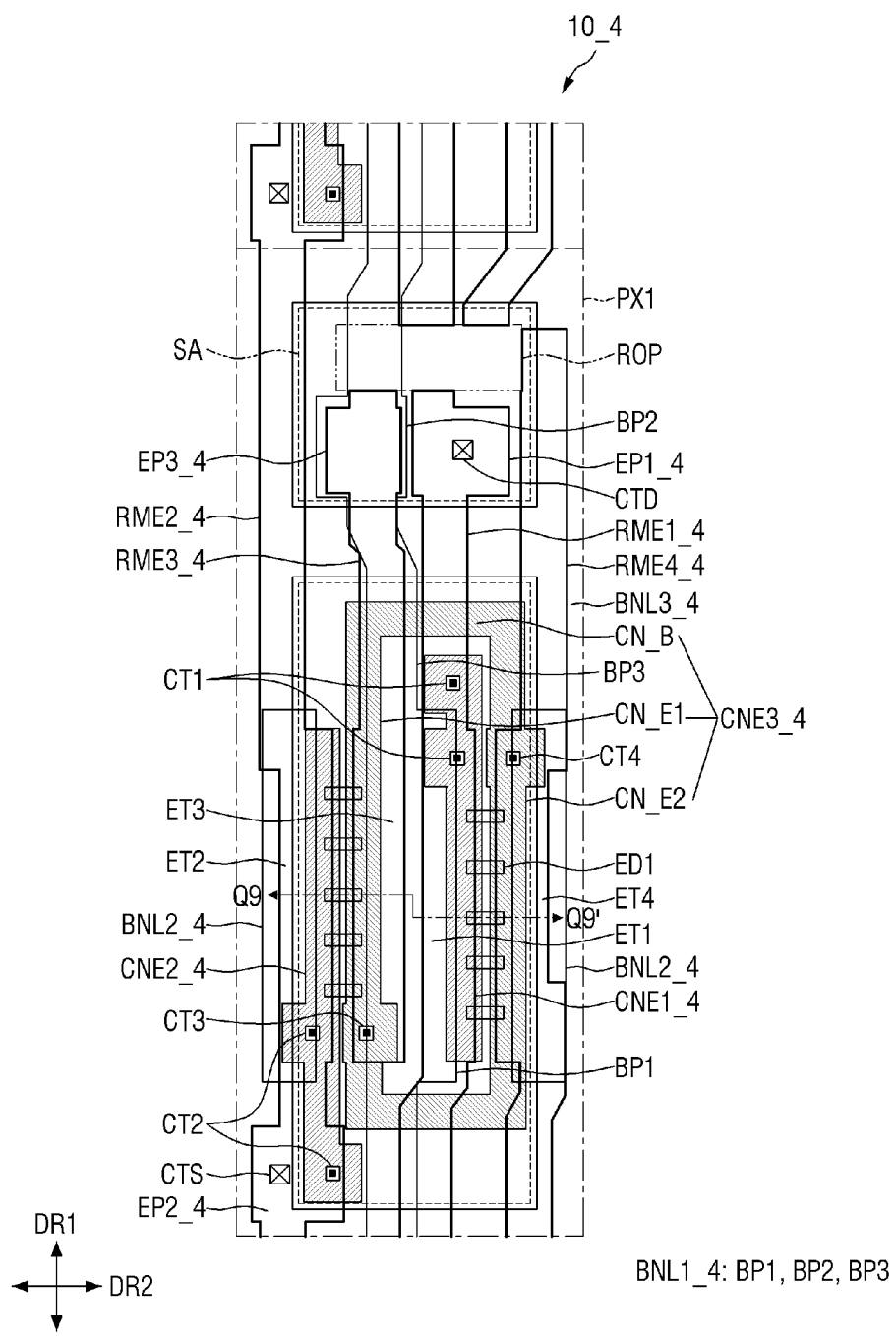
FIG. 19 is a plan view of a first subpixel of FIG. 18.
Figure 20:
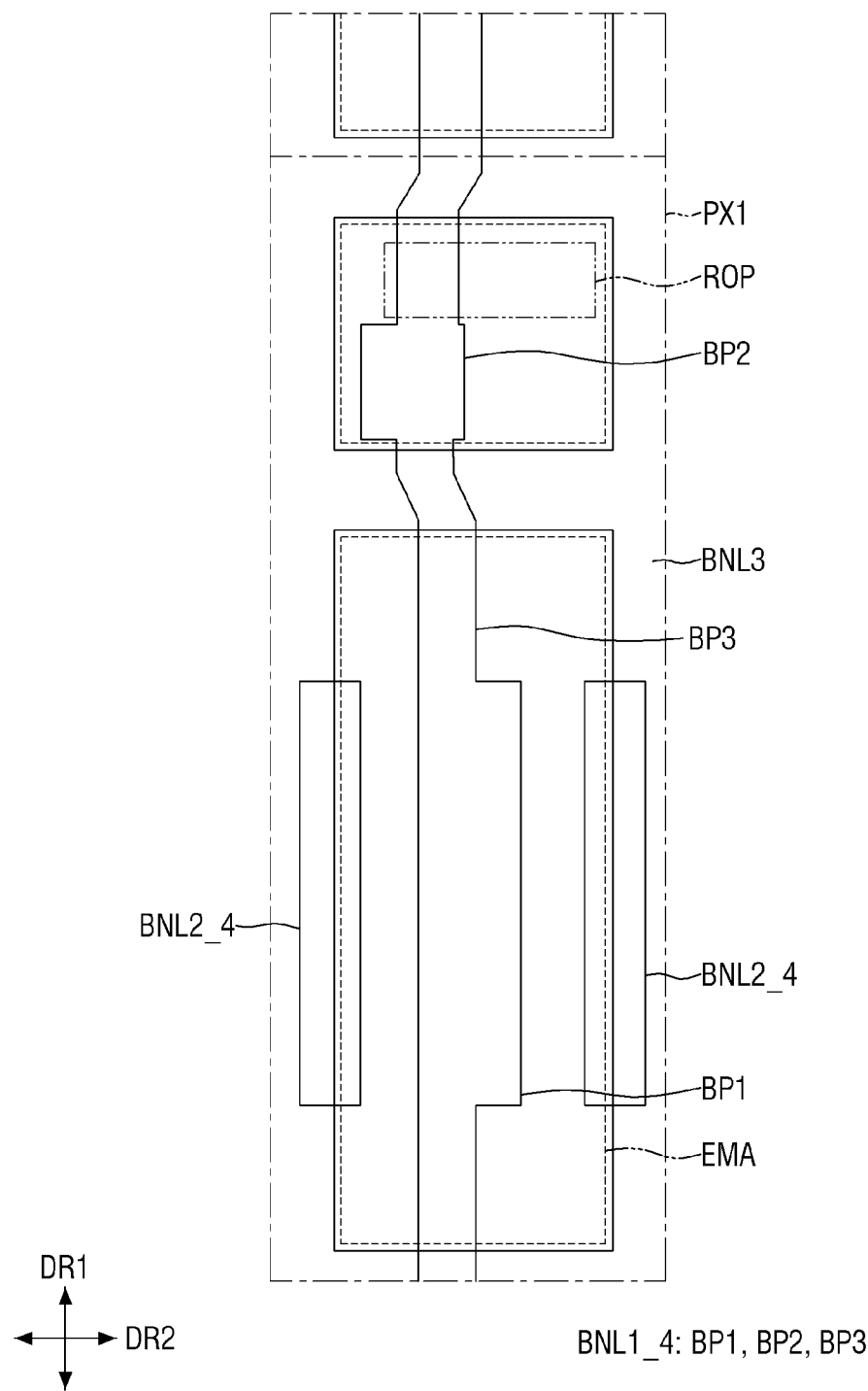
FIG. 20 is a plan view illustrating the relative arrangement of a first bank, second banks, and a third bank in the first subpixel of FIG. 18.
Figure 21:
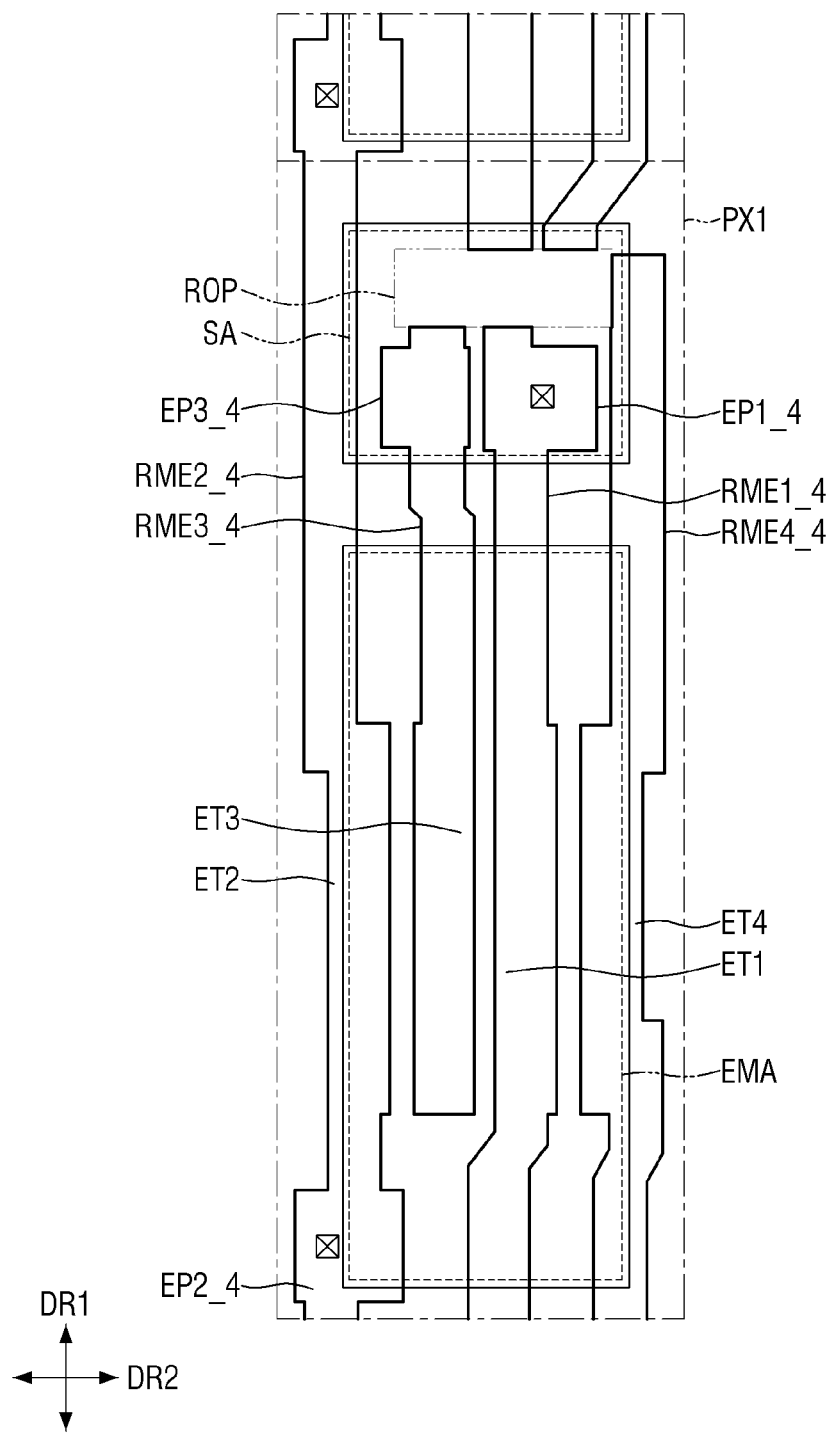
FIG. 21 is a plan view illustrating the relative arrangement of a plurality of electrodes and the third bank in the first subpixel of FIG. 18.
Figure 22:
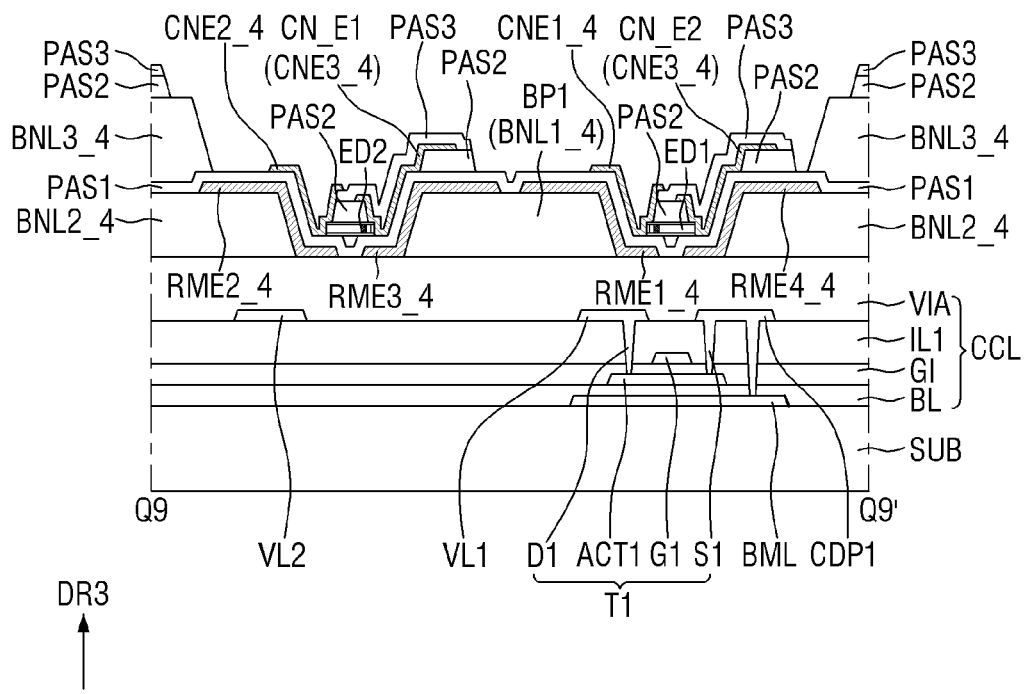
FIG. 22 is a cross-sectional view taken along line Q10-Q10' of FIG. 19.

FIG. 18 is a plan view of a pixel of a display device 10_4 according to an embodiment. FIG. 19 is a plan view of a first subpixel of FIG. 18. FIG. 20 is a plan view illustrating the relative arrangement of a first bank BNL1_4, second banks BNL2_4, and a third bank BNL3_4 in the first subpixel of FIG. 18. FIG. 21 is a plan view illustrating the relative arrangement of a plurality of electrodes RME_4 and the third bank BNL3_4 in the first subpixel of FIG. 18. FIG. 22 is a cross-sectional view taken along line Q10-Q10' of FIG. 19. FIG. 22 illustrates a cross section across opposing ends of light emitting elements ED.

Referring to FIGS. 18 through 22, in an embodiment of the display device 10_4, the electrodes RME4 and the banks BNL1_4. BNL2_4 and BNL3_4 may have a different structure from those of the embodiment of FIG. 3. The functions or roles of the electrodes RME_4 and the banks BNL1_4, BNL2_4 and BNL3_4 are the same as those described above, and thus only the arrangement of the members will be described in detail below.

The first bank BNL1_4 may extend in the first direction DR1 across a plurality of subpixels PXn arranged in the first direction DR1 beyond an emission area EMA and a sub area SA. The first bank BNL1_4 may include a first bank part BP1 disposed between the second banks BNL2_4, a second bank part BP2 disposed in the sub area SA, and a third bank part BP3 connecting the first bank part BP1 and the second bank part BP2.

The first bank part BP1 is a part on which a first electrode RME1_4 and a third electrode RIM 3_4 are disposed and may be spaced apart from the second banks BNL2_4 to form spaces in which the light emitting elements ED are disposed. The first bank part BP1 may have a relatively greater width than the third bank part BP3 so that the electrodes RME_4 may be disposed thereon. The second bank part BP2 may be disposed in the sub area SA and may have a greater width than the first bank part BP1 and the third bank part BP3. A third electrode expansion part EP3_4 of the third electrode RME3_4 may be disposed on the second bank part BP2 and may form a flat and relatively high planar surface in the sub area SA. The third bank part BP3 may generally extend in the first direction DR1 and may be partially bent. The third bank part BP3 is a part of the first bank BNL1_4 which connects the first bank part BP1 and the second bank part BP2 arranged along the first direction DR1. The third bank part BP3 may be defined by a part of the first bank BNL1_4 other than the first bank part BP1 and the second bank part BP2.

The second banks BNL2_4 may have substantially a same shape as those of the embodiment of FIG. 3 but may partially overlap the third bank BNL3_4. The first bank BNL_4 may have a linear shape generally extending in one direction in the entire display area DPA, and the second banks BNL2_4 may have an island shape. In an embodiment, parts of the third bank BNL3_4 extending in the first direction DR1 may be partially disposed on the second banks BNL2_4, and a part of the third hank BNL3_4 extending in the second direction DR2 may be disposed over the third bank part BP3 of the first bank BNL1_4 between the emission area EMA and the sub area SA.

The electrodes RME_4 may generally extend in the first direction DR1 but may be partially widened or bent. According to an embodiment, the electrodes RME_4 may include main electrode parts ET1 through ET4 disposed on the first bank part BP1 of the first bank BNL1_4 or the second banks BNL2_4. The main electrode parts ET1 through ET4 may have a relatively greater width than other parts of the electrodes RME_4, and a distance between the main electrode parts ET1 through ET4 may be smaller than a distance between other parts of the electrodes RME_4. The main electrode parts ET1 through ET4 of the electrodes RME_4 may be parts on which opposing ends of the light emitting elements ED are disposed.

A first main electrode part ET1 of the first electrode RME1_4 is disposed on the first bank part BP1 of the first bank BNL1_4. A second main electrode part ET2 of a second electrode RME2_4 is disposed on the second bank BNL2_4 located on a left side of the emission area EMA, and a third main electrode part ET3 of the third electrode RIM 3_4 is disposed on the first bank part BP1 and spaced apart from the first main electrode part ET1. A fourth main electrode part ET4 of a fourth electrode RME4_4 is disposed on the second bank BNL2_4 located on a right side of the emission area EMA. Each of the main electrode parts ET1 through ET4 of the electrodes RME_4 may have a greater width than other parts and may protrude toward another facing main electrode part ET1, ET2, ET3 or ET4 in the second direction DR2. In one embodiment, for example, a side of the first electrode RME1_4 may protrude from the first main electrode part ET1 toward the fourth electrode RME4_4, and a side of the second electrode RME2_4 may protrude from the second main electrode part ET2 toward the third electrode RME3_4. A side of the third electrode RME3_4 may protrude from the third main electrode part ET3 toward the second electrode RME2_4, and a side of the fourth electrode RME4_4 may protrude from the fourth main electrode part ET4 toward the first electrode RME1_4.

As the electrodes RME_4 extend in the first direction DR1, a distance therebetween in the second direction DR2 may be reduced in the main electrode parts ET1 through ET4. The light emitting elements ED may be aligned by an electric field generated on electrode lines spaced apart in the second direction DIU, and a stronger electric field may be generated as the distance between the electrode lines decreases. Since the electrode lines or the electrodes RME_4 further include the main electrode parts ET1 through ET4 having a different width from other parts and thus spaced apart by a smaller distance in the second direction DR2, the electrode lines or the electrodes RME_4 may generate a locally strong electric field.

Figure 23:
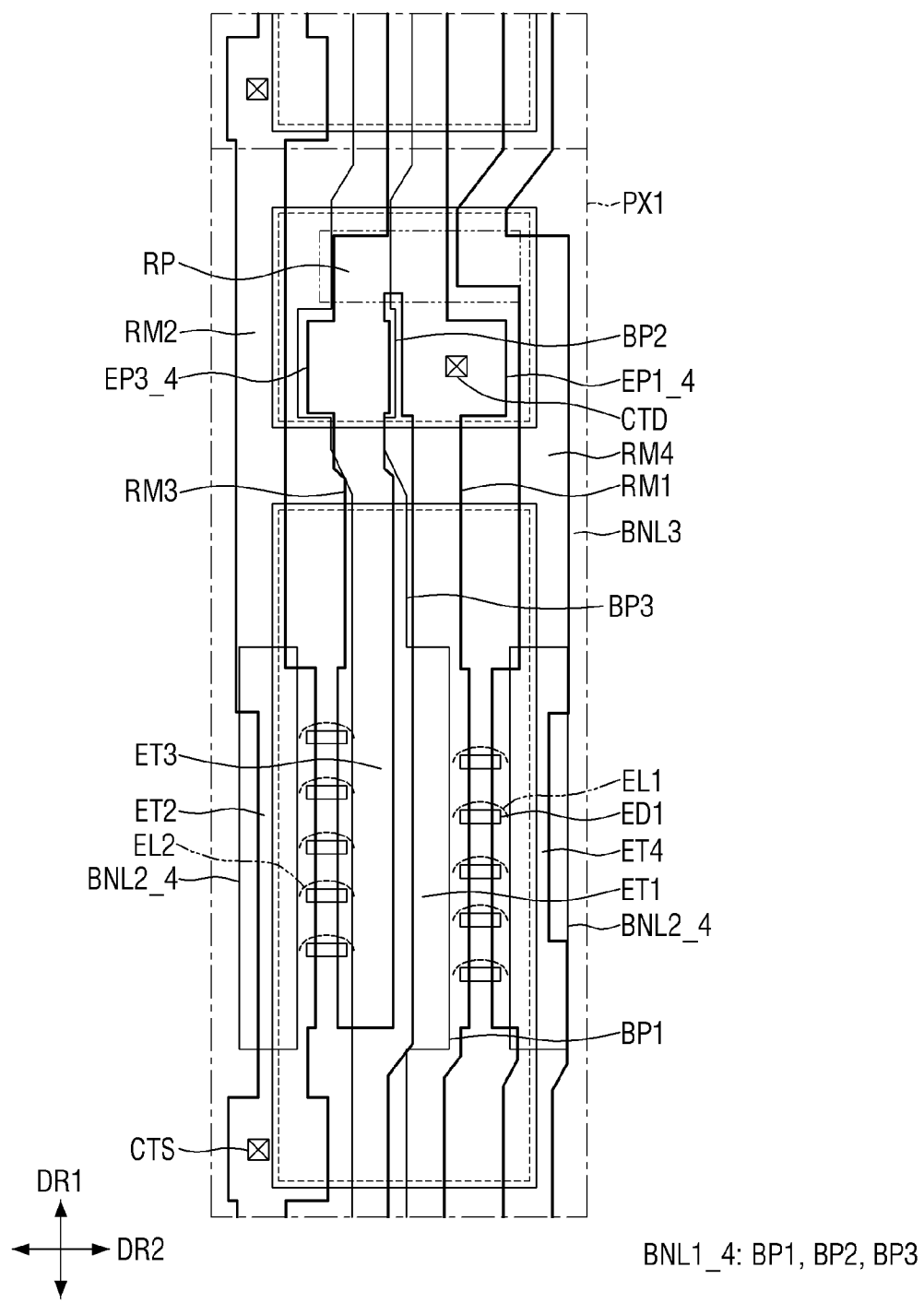
FIG. 23 is a plan view illustrating an operation in a process of manufacturing the display device of FIG. 18.

FIG. 23 is a plan view illustrating an operation in a process of manufacturing the display device 10_4 of FIG. 18.

Referring to FIG. 23, electrode lines RM1 through RM4 formed in the manufacturing process of the display device 10_4 include the main electrode parts ET1 through ET4, such that a distance between the electrode lines RM1 through 1044 may be partially reduced. In such an embodiment, the electrode lines RM1 through RM4 may generate electric fields EL1 and EL2 according to alignment signals transmitted thereto, and strong electric fields EL1 and EL2 may be intensively generated on the main electrode parts ET1 through ET4. Accordingly, in such an embodiment of the display device 104, the light emitting elements ED may be easily intensively placed at a specific position on the electrodes RME_4, and the misplacement rate of the light emitting elements ED can be further reduced.

A third electrode line RM3 may be integrally formed with a first electrode line RM1 and a routing part RP as a single unitary unit. A fourth electrode line RM4 may extend in the first direction while overlapping the third bank BNL3_4 and may be bent inward in the sub area SA to pass through a separation part ROP. The first electrode line RM1, the third electrode line RM3, and the fourth electrode line RM4 may be separated in the separation part ROP to form the first electrode RME1_4, the third electrode RME3_4, and the fourth electrode RME4_4, respectively.

In such an embodiment, a second electrode line RM2 may extend in the first direction DIU without passing through the separation part ROP in the sub area SA. The electrodes RME_4 or the electrode lines may be classified into different types according to arrangement structure or whether separated or not. As described above, the first electrode RME1_4 and the fourth electrode RME4_4 may be first type electrodes which are separated in the separation part ROP of the sub area SA and are also disposed at the boundary between subpixels PXn, and the third electrode RME3_4 may be a second type electrode which is disposed across the emission area EMA and the sub area SA. In such an embodiment, the second electrode RME2_4 may extend in the first direction DR1 but may not be separated in the separation part ROP of the sub area SA. In an embodiment, the display device 10_4 may further include a third type electrode not separated in the separation part ROP and disposed across a plurality of subpixels PXn arranged in the first direction DR1, in addition to first and second type electrodes.

The second electrode RME2_4 which is a third type electrode may be connected to a second voltage line VL2 to receive a second power supply voltage. Since the first electrode RME1_4 is a first type electrode separated in the separation part ROP, even if the second electrode RME2_4 is not separated in each subpixel PXn, the subpixels PXn may emit light individually due to the first electrode RME1_4. In such an embodiment of the display device 10_4 including a third type electrode, the number of electrode lines separated in the separation part ROP is reduced, thereby reducing residues of an electrode material remaining after a separation process.

The first electrode RME1_4, the second electrode RME2_4, and the third electrode RME3_4 may further include electrode expansion parts EP1_4, EP2_4 and EP3_4 in addition to the main electrode parts as described above. In such an embodiment, a first electrode expansion part EP1_4 of the first electrode RME1_4 may be disposed in the sub area SA. The first electrode expansion part EP1_4 may contact a third conductive layer thereunder through a first electrode contact hole CTD. A second electrode expansion part EP2_4 of the second electrode RME2_4 may be disposed in the emission area EDTA and may contact the third conductive layer thereunder through a second electrode contact hole CTS.

The third electrode expansion part EP3_4 of the third electrode RME3_4 is disposed on the second bank part BP2 of the first bank BNL1_4 in the sub area SA. The third electrode expansion part EP3_4 may provide a space in which some dummy patterns is disposed in the sub area SA. Although not illustrated in the drawings, dummy patterns indicating the arrangement relationship between layers disposed on the electrodes RME_4, for example, a plurality of insulating layers PAS1 through PAS3, and contact electrodes CNE1_4 through CNE3_4 may be further disposed on the third electrode expansion part EP3_4.

Opposing ends of the light emitting elements ED may be disposed on the main electrode parts of the electrodes RME_4. First light emitting elements ED1 may be disposed on the first main electrode part ET1 and the fourth main electrode part ET4, and second light emitting elements ED2 may be disposed on the second main electrode part ET2 and the third main electrode part ET3.

The contact electrodes CNE1_4 through CNE3_4 may be disposed in substantially, the same shape as those of the embodiment of FIG. 3. A first contact electrode CNE1_4 may be disposed on the first main electrode part ET1, and a second contact electrode CNE2_4 may be disposed on the second main electrode part ET2 and may extend up to the second electrode expansion part EP2_4. The first contact electrode CNE1_4 and the second contact electrode CNE2_4 may contact the first electrode RME1_4 and the second electrode RME2_4 through a plurality of first contact parts CT1 and a plurality of second contact parts CT2, respectively.

A third contact electrode CNE3_4 may have a first extending part CN_E1 disposed on the third main electrode part ET3 and a second extending part CN_E2 disposed on the fourth main electrode part ET4. The first extending part CN_E1 and the second extending part CN_E2 may be connected to each other through a first connecting part CN_B and may surround the first contact electrode CNE1_4.

Figure 24:
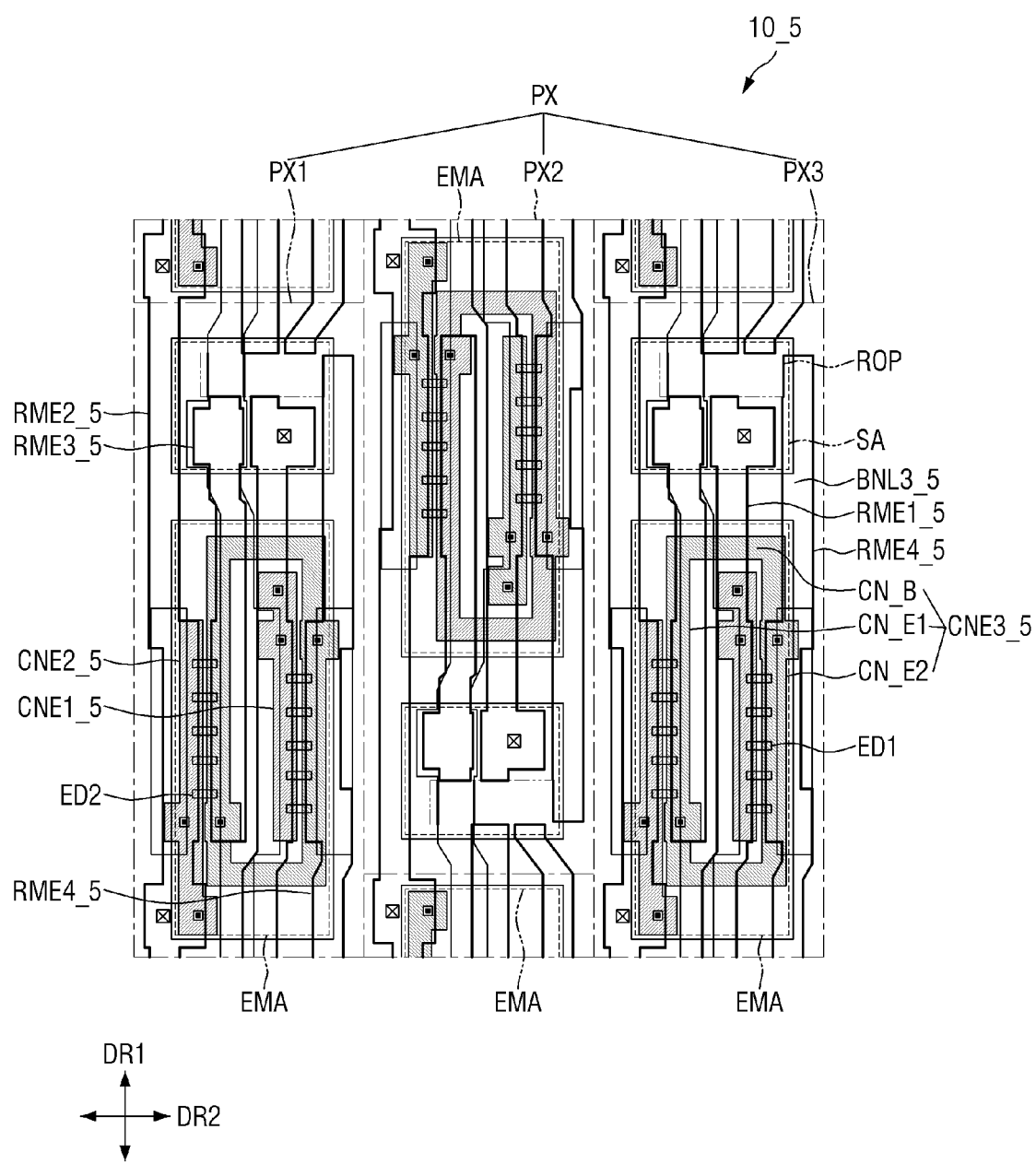
FIG. 24 is a plan view of a pixel of a display device according to an embodiment.
Figure 25:
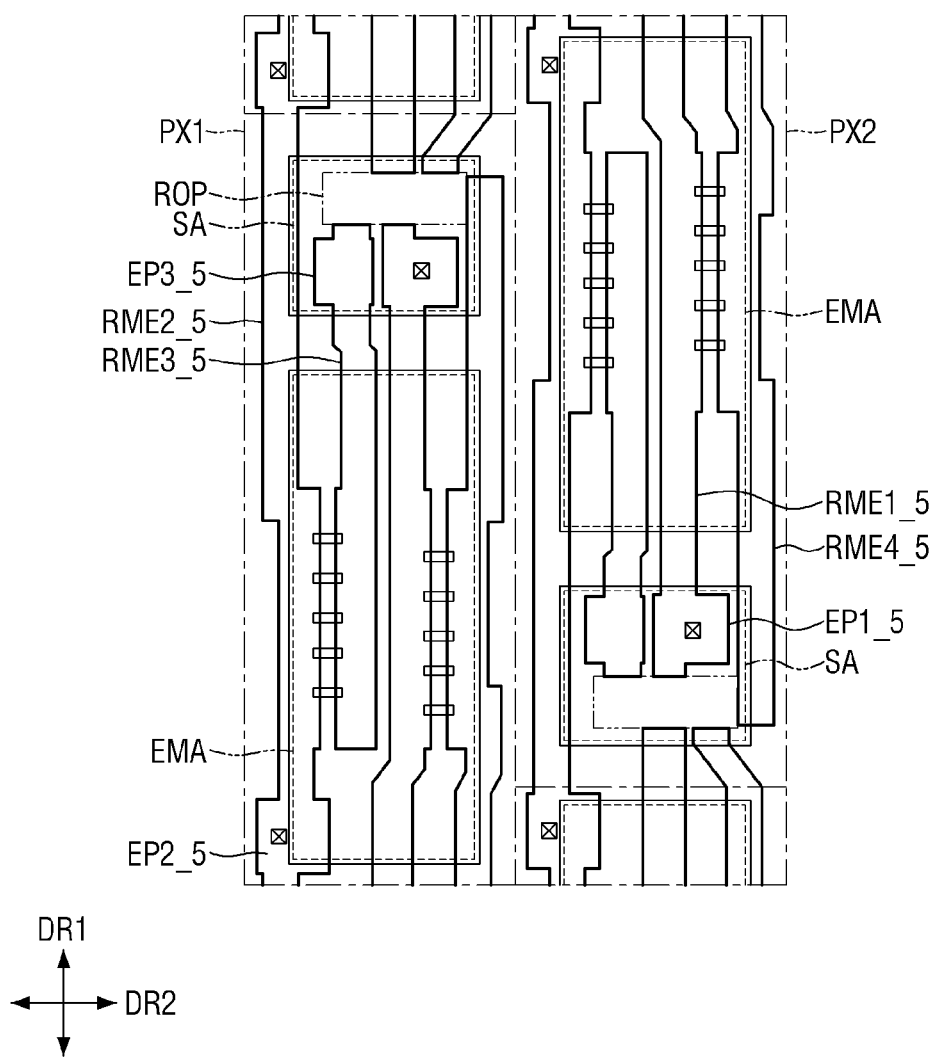
FIG. 25 is a plan view illustrating the relative arrangement of a plurality of electrodes and a third bank in a first subpixel and a second subpixel of FIG. 24.

FIG. 24 is a plan view of a pixel PX of a display device 10_5 according to an embodiment. FIG. 25 is a plan view illustrating the relative arrangement of a plurality of electrodes RME_5 and a third bank BNL3_5 in a first subpixel PX1 and a second subpixel PX2 of FIG. 24.

Referring to FIGS. 24 and 25, an embodiment of the display device 10_5 may be substantially the same as the embodiment of FIG. 18 except for the arrangement of emission areas EMA and sub areas SA of subpixels PXn arranged in the second direction DR2. The arrangement of the emission area EMA and the sub area SA may vary according to the shape of the third bank BNL3_5 in a plan view or the position of an opening area defined by the third bank BNL3_5. Accordingly, the arrangement of the electrodes RME_5 and contact electrodes CNE1_5, CNE2_5 and CNE3_5 may also be different in each subpixel PXn.

According to an embodiment, each pixel PX of the display device 10_5 may include subpixels PXn having different arrangements of the emission area EMA and the sub area SA from each other. In each subpixel PXn included in one pixel PX, the emission area EMA and the sub area SA neighbor each other in the first direction DR1. In some subpixels PXn, however, the direction in which the sub area SA is disposed with respect to the emission area EMA may be different from each other. In such an embodiment, the emission areas EMA and the sub areas SA of different subpixels PXn may be alternately arranged along the second direction DR2 in a same way that the emission area EMA and the sub area SA of each subpixel PXn are alternately arranged along the first direction DR1.

In one embodiment, for example, in the first subpixel PX1 and a third subpixel PX3, the sub area SA may be disposed on an upper side of the emission area EMA which is a side of the first direction DR1. In the second subpixel PX2, the sub area SA may be disposed on a lower side of the emission area EMA which is the other side of the first direction DR1. The emission areas EMA of the first through third subpixels PX1 through PX3 may not be aligned with each other in the second direction DR2. A first emission area EMA1 and a third emission area EMA3 may be aligned with each other in the second direction DR2, but the sub area SA of the second subpixel PX2 may be disposed between them. In such an embodiment, the sub areas SA of the subpixels PXn may not neighbor each other in the first direction DR1 or the second direction DR2 and may be spaced apart from each other in one direction or in a diagonal direction. In one embodiment, for example, the sub areas SA of the first subpixel PX1 and the third subpixel PX3 may be aligned with each other in the second direction DR2 but may be spaced apart from each other not to neighbor each other, and a second emission area EMA2 may be disposed between them. The sub area SA of the second subpixel PX2 may be spaced apart from the sub areas SA of the first subpixel PX1 and the third subpixel PX3 in the diagonal direction. Accordingly, a plurality of emission areas EMA may be disposed in an island structure in which emission areas, e.g., the first emission area EMA1 and the third emission area EMA3 are each disposed in the diagonal direction between the first direction DR1 and the second direction DR2 with respect to one emission area EMA, e.g., the second emission area EMA2.

Such arrangement of the subpixels PXn may result from the planar structure of the third bank BNL3_5. The third bank BNL3_5 may include parts extending in the first direction DR1 and the second direction DR2, but the parts extending in the second direction DR2 may have a relatively short length, unlike the parts extending in the first direction DR1. The emission areas EMA may be located between the parts of the third bank BNL3_5 which extend in the second direction DR2.

Since the first subpixel PX1 and the third subpixel PX3 have a different arrangement of the emission area EMA and the sub area SA from the second subpixel PX2 from each other, the arrangement of the electrodes RME may be different according to the type of subpixel PXn. In the first subpixel PX1 and the third subpixel PX3, the sub area SA may be disposed on the upper side of the emission area EMA, and a third electrode RME_5 may extend downward from a third electrode expansion part EP3_5. In such an embodiment, in the second subpixel PX2, the sub area SA may be disposed on the lower side of the emission area EMA, and the third electrode RME3_5 may extend upward from the third electrode expansion part EP3_5. A first electrode RME1_5, a second electrode RME2_5, and a fourth electrode RME4_5 may be disposed according to the structure of a subpixel PXn. In such an embodiment, the first electrode RME1_5 and the second electrode RME2_5 may further include electrode expansion parts EP1_5 and EP2_5 having a relatively large width.

Since the sub areas SA are spaced apart in the diagonal direction, first electrode contact holes CTD of the first electrodes RME1_5 may be arranged in the diagonal direction. The position of a second conductive pattern CDP2 which contacts the first electrode RME1_5 may be changed according to the structure of a subpixel PXn.

In embodiments of a display device according to the invention, the intensity of an electric field generated in an unwanted area is substantially reduced and misplacement of light emitting elements aligned by an electric field is substantially minimized by connection structure of electrodes or electrode lines.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a plurality of subpixels arranged in a first direction and a second direction different from the first direction, wherein each of the subpixels comprises an emission area and a sub area arranged in the first direction therein;
a plurality of electrodes extending in the first direction across the emission area and the sub area, wherein the electrodes comprises a first electrode, a second electrode spaced apart from the first electrode in the second direction, a third electrode disposed between the first electrode and the second electrode, and a fourth electrode spaced apart from the third electrode in the second direction with the first electrode interposed therebetween;
a plurality of first light emitting elements disposed on the first electrode and the fourth electrode; and
a plurality of second light emitting elements disposed on the second electrode and the third electrode,
wherein a length of the third electrode in the first direction is smaller than a length of the first electrode in the first direction.

2. The display device of claim 1, wherein a number of the electrodes disposed at a boundary between subpixels neighboring in the first direction is smaller than a number of the electrodes disposed in the emission area.

3. The display device of claim 2, wherein
the emission area comprises a first portion in which the third electrode is disposed and a second portion in which the third electrode is not disposed, and
an average distance between the electrodes spaced apart in the second direction in the first portion is smaller than an average distance between the electrodes spaced apart in the second direction in the second portion.

4. The display device of claim 1, wherein
each of the first electrode and the fourth electrode includes an end in the first direction disposed in the sub area and another end disposed in the sub area of another subpixel neighboring in the first direction, and
the third electrode includes an end in the first direction disposed in the sub area and another end disposed in the emission area.

5. The display device of claim 4, wherein the second electrode extends in the first direction across the subpixels arranged in the first direction.

6. The display device of claim 4, wherein
the first electrode further comprises a first electrode expansion part disposed in the sub area, and
the second electrode further comprises a second electrode expansion part disposed in the emission area,
wherein the first electrode expansion part is connected to a conductive layer thereunder through a first electrode contact hole, and
the second electrode expansion part is connected to a conductive layer thereunder through a second electrode contact hole.

7. The display device of claim 6, wherein the third electrode further comprises a third electrode expansion part disposed in the sub area.

8. The display device of claim 4, wherein
each of the electrodes comprise a plurality of main electrode parts disposed in the emission area, respectively, and
a distance between the main electrode parts of the electrodes spaced apart in the second direction is smaller than a distance between other parts of the electrodes.

9. The display device of claim 8, wherein
ends of the first light emitting elements are disposed on a first main electrode part of the first electrode and a fourth main electrode part of the fourth electrode, and
ends of the second light emitting elements are disposed on a second main electrode part of the second electrode and a third main electrode part of the third electrode.

10. The display device of claim 9, wherein a direction in which first ends of the first light emitting elements face is opposite to a direction in which first ends of the second light emitting elements face.

11. The display device of claim 4, wherein
the subpixels comprise a first subpixel and a second subpixel neighboring the first subpixel in the second direction, and
the emission area of the second subpixel is located diagonally to the emission area of the first subpixel.

12. The display device of claim 11, wherein
the another end of the third electrode of the first subpixel extends from the end disposed in the sub area toward a side of the first direction, and
the another end of the third electrode of the second subpixel extends from the end disposed in the sub area toward another side of the first direction.

13. The display device of claim 1, further comprising:
a first insulating layer disposed on the electrodes;
a first contact electrode disposed on the first electrode to contact the first light emitting elements;

a second contact electrode disposed on the second electrode to contact the second light emitting elements; and a third contact electrode disposed on the third electrode and the fourth electrode to contact the first light emitting elements and the second light emitting elements, wherein the first light emitting elements and the second light emitting elements are disposed directly on the first insulating layer.

14. The display device of claim 13, wherein the third contact electrode comprises a first extending part disposed on the third electrode, a second extending part disposed on the fourth electrode, and a plurality of first connecting parts connecting the first extending part and the second extending part to surround the first contact electrode.

15. The display device of claim 14, wherein the first contact electrode contacts the first electrode by a first contact part disposed through the first insulating layer, the second contact electrode contacts the second electrode by a second contact part disposed through the first insulating layer, the first extending part of the third contact electrode contacts the third electrode by a third contact part disposed through the first insulating layer, and the second extending part of the third contact electrode contacts the fourth electrode by a fourth contact part disposed through the first insulating layer.

16. The display device of claim 15, wherein the first contact part, the second contact part, the third contact part, and the fourth contact part are disposed in the sub area.

17. A display device comprising:

a plurality of subpixels arranged in a first direction and a second direction different from the first direction, wherein each of the subpixels comprises an emission area and a sub area arranged in the first direction therein;

a plurality of electrodes extending in the first direction and spaced apart from each other in the second direction; and a plurality of light emitting elements disposed on the electrodes and spaced apart from each other in the second direction, wherein the electrodes comprise a plurality of first type electrodes extending from the sub area of one subpixel to the sub area of another subpixel neighboring in the first direction beyond the emission area of the one subpixel and a second type electrode disposed across the sub area and the emission area of one subpixel.

18. The display device of claim 17, wherein the electrodes further comprise a third type electrode extending in the first direction across the subpixels arranged in the first direction.

19. The display device of claim 18, wherein the emission area comprises a first portion in which the second type electrode is disposed and a second portion in which the second type electrode is not disposed, and an average distance between the electrodes spaced apart in the second direction in the first portion is smaller than an average distance between the electrodes spaced apart in the second direction in the second portion.

20. The display device of claim 18, wherein a length of each of the first type electrodes in the first direction is greater than a length of the second type electrode in the first direction.

* * * * *